US011620948B2

(12) United States Patent
Wang

(10) Patent No.: US 11,620,948 B2
(45) Date of Patent: Apr. 4, 2023

(54) PIXEL DRIVING CIRCUIT, METHOD FOR DRIVING PIXEL DRIVING CIRCUIT, DISPLAY PANEL, AND DISPLAY APPARATUS

(71) Applicants: WUHAN TIANMA MICROELECTRONICS CO., LTD., Wuhan (CN); Wuhan Tianma Microelectronics Co., Ltd. Shanghai Branch, Shanghai (CN)

(72) Inventor: Lanlan Wang, Wuhan (CN)

(73) Assignees: WUHAN TIANMA MICROELECTRONICS CO., LTD., Wuhan (CN); Wuhan Tianma Microelectronics Co., Ltd. Shanghai Branch, Pudong New District (CN)

( * ) Notice: Subject to any disclaimer, the term of this patent is extended or adjusted under 35 U.S.C. 154(b) by 0 days.

(21) Appl. No.: 17/737,379

(22) Filed: May 5, 2022

(65) Prior Publication Data

US 2022/0262313 A1    Aug. 18, 2022

(30) Foreign Application Priority Data

Jan. 28, 2022 (CN) ......................... 202210106433.X

(51) Int. Cl.
*G09G 3/3233* (2016.01)
*H01L 27/12* (2006.01)

(52) U.S. Cl.
CPC ..... *G09G 3/3233* (2013.01); *G09G 2310/061* (2013.01); *G09G 2310/08* (2013.01);
(Continued)

(58) Field of Classification Search
CPC .......... G09G 3/3233; G09G 2310/061; G09G 2310/08; G09G 2320/0214;
(Continued)

(56) References Cited

U.S. PATENT DOCUMENTS

2017/0047003 A1* 2/2017 Kim .................. H01L 27/3262
2017/0110054 A1* 4/2017 Sun .................... G09G 3/3258
(Continued)

FOREIGN PATENT DOCUMENTS

CN    212990650 U    4/2021
CN    112967652 A    6/2021

OTHER PUBLICATIONS

Dictionary.com, "adjacent," in Dictionary.com Unabridged. Source location: Random House, Inc. http://dictionary.reference.com/browse/adjacent, Nov. 18, 2011, p. 1.*

*Primary Examiner* — Jeff Piziali
(74) *Attorney, Agent, or Firm* — Christensen O'Connor Johnson Kindness PLLC

(57) ABSTRACT

A pixel driving circuit, a method for driving the same, a display panel, and a display apparatus are provided. In the pixel driving circuit, a power voltage writing module includes an input terminal electrically connected to a power voltage signal line and an output terminal electrically connected to a driving module, a data voltage writing module includes an input terminal electrically connected to a data voltage signal line and an output terminal electrically connected to the driving module, and a light-emitting control module includes an input terminal electrically connected to the driving module and an output terminal electrically connected to the light-emitting module. A control terminal of the power voltage writing module, a control terminal of the light-emitting control module and a control terminal of the data voltage writing module are electrically connected to a first scan line.

19 Claims, 12 Drawing Sheets

(52) U.S. Cl.
CPC ............... *G09G 2320/0214* (2013.01); *G09G 2320/0233* (2013.01); *H01L 27/1225* (2013.01); *H10K 59/1213* (2023.02)

(58) Field of Classification Search
CPC .......... G09G 2320/0233; G09G 3/3208; H01L 27/1225; H01L 27/3262
See application file for complete search history.

(56) References Cited

U.S. PATENT DOCUMENTS

| | | | | |
|---|---|---|---|---|
| 2018/0130424 A1* | 5/2018 | Gao | ................... | G09G 3/3291 |
| 2018/0144681 A1* | 5/2018 | Xiang | ................. | G09G 3/3233 |
| 2018/0151123 A1* | 5/2018 | Li | ........................ | G09G 3/3233 |
| 2019/0096327 A1* | 3/2019 | Peng | .................. | G09G 3/3233 |
| 2019/0130833 A1* | 5/2019 | Gao | ................... | G09G 3/3291 |
| 2019/0147796 A1* | 5/2019 | Rha | .................... | G09G 3/3233 |
| | | | | 345/691 |
| 2019/0295469 A1* | 9/2019 | Umezawa | ............... | G09G 3/20 |
| 2020/0211474 A1* | 7/2020 | Kim | .................. | G09G 3/3233 |
| 2020/0226978 A1* | 7/2020 | Lin | .................... | G09G 3/3258 |
| 2020/0410926 A1* | 12/2020 | Li | ........................ | G09G 3/3233 |
| 2021/0241672 A1* | 8/2021 | Gao | .................... | G09G 3/3233 |
| 2022/0114943 A1* | 4/2022 | Cao | .................... | G09G 3/3258 |
| 2022/0230592 A1* | 7/2022 | Zhao | .................. | G09G 3/3258 |

\* cited by examiner

During a data voltage writing stage, transmitting a first control signal by a first scan line, controlling, by the first control signal, a data voltage writing module to be turned on, and controlling, by the first control signal, a power voltage writing module and a light-emitting control module to be turned off S1 — During a reset stage, transmitting a second control signal by a first scan line, transmitting a third control signal by a second scan line, controlling, by the second control signal, a data voltage writing module to be turned off and a third transistor to be turned on, and controlling, by the third control signal, a first transistor to be turned on and a fifth transistor to be turned off S2 — during a data voltage writing stage, transmitting the first control signal by the first scan line, transmitting a fourth control signal by the second scan line, controlling, by the first control signal, the data voltage writing module to be turned on and the third transistor to be turned off, and controlling, by the fourth control signal, the first transistor to be turned off and the fifth transistor to be turned on S3 — during a light-emitting stage, transmitting the second control signal by the first scan line, transmitting a fourth control signal by the second scan line, controlling, by the second control signal, the data voltage writing module to be turned off and the third transistor to be turned on, and controlling, by the fourth control signal, the first transistor to be turned off and the fifth transistor to be turned on

FIG. 10

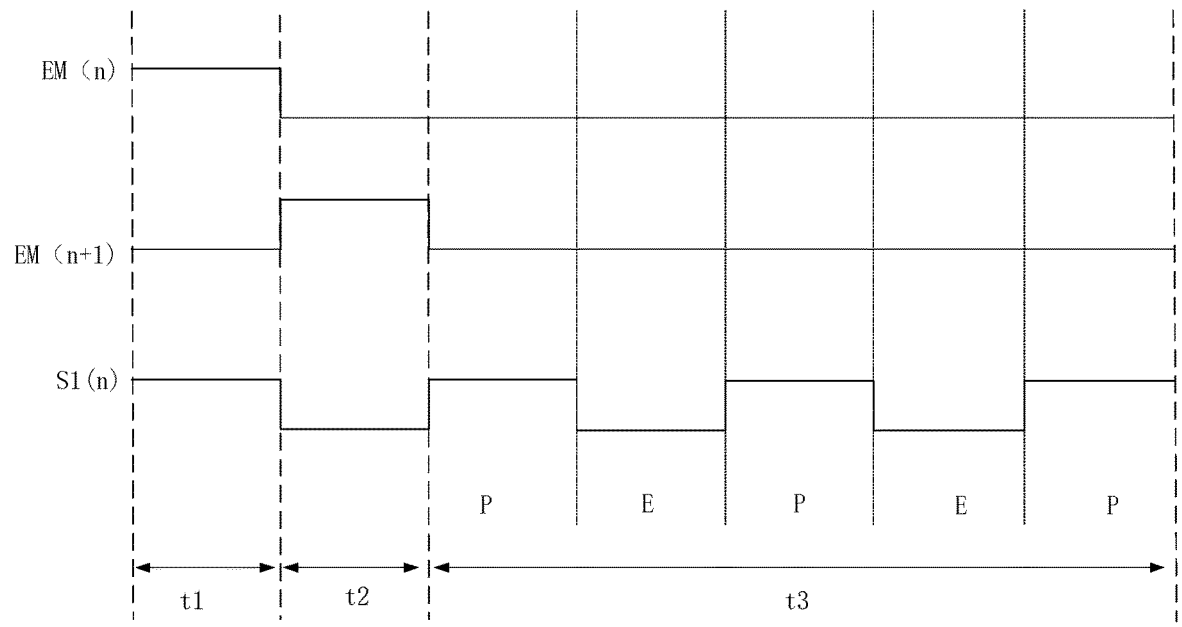

FIG. 11

During an adjustment stage, transmitting a first control signal by a first scan line, transmitting a fourth control signal by a second scan line, controlling, by the first control signal, a data voltage writing module to be turned on and a power voltage writing module and a light-emitting control module to be turned off, and controlling, by the fourth control signal, a seventh transistor to be turned off

FIG. 12

PIXEL DRIVING CIRCUIT, METHOD FOR DRIVING PIXEL DRIVING CIRCUIT, DISPLAY PANEL, AND DISPLAY APPARATUS

CROSS-REFERENCE TO RELATED APPLICATION

The present disclosure claims priority to Chinese Patent Application No. 202210106433.X, filed on Jan. 28, 2022, the content of which is incorporated herein by reference in its entirety.

TECHNICAL FIELD

The present disclosure relates to the field of display technologies, and, particularly, relates to a pixel driving circuit, a method for driving a pixel driving circuit, a display panel, and a display apparatus.

BACKGROUND

Oxide semiconductor transistors have high electron mobility, large on-off ratio, low off-state leakage current, low power consumption, and other useful properties. In a pixel driving circuit of a display panel, the oxide semiconductor transistor is usually used as a switch connecting a control terminal of a light-emitting driving transistor. When the control terminal of the light-emitting driving transistor in the pixel driving circuit is connected to the oxide semiconductor transistor, the leakage current of the control terminal of the light-emitting driving transistor is reduced, and the pixel driving circuit can achieve low-frequency driving. Indium gallium zinc oxide (IGZO) transistors are common oxide semiconductor transistors.

However, in the related art, channel types of the oxide semiconductor transistors are often different from that of the common transistors, when the oxide semiconductor transistors are adopted in the pixel driving circuit in the related art, the peripheral driving circuit of the pixel driving circuit becomes very complicated, and many signal lines are provided, which makes it difficult to meet the requirements of many designs of the display panel. Moreover, an area occupied by the peripheral driving circuit in the border region of the display panel is increased, which is not conducive to achieving a narrow bezel of the display panel.

SUMMARY

In a first aspect of the present disclosure, a pixel driving circuit is provided. The pixel driving circuit includes a light-emitting module, a driving module, a power voltage writing module, a data voltage writing module, and a light-emitting control module. The driving module is configured to provide a light-emitting driving current for the light-emitting module and comprising an input terminal and an output terminal. The power voltage writing module includes a first input terminal, a first output terminal, and a first control terminal, the first input terminal is electrically connected to a power voltage signal line, and the first output terminal is electrically connected to the input terminal of the driving module. The data voltage writing module includes an input terminal electrically connected to a data voltage signal line, an output terminal electrically connected to the driving module, and a control terminal. The light-emitting control module includes a second input terminal, a second output terminal, and a second control terminal, the second input terminal is electrically connected to the output terminal of the driving module, and the second output terminal is electrically connected to the light-emitting module. The first control terminal of the power voltage writing module, the second control terminal of the light-emitting control module, and the control terminal of the data voltage writing module are electrically connected to a first scan line. The power voltage writing module and the light-emitting control module are controlled to be turned off when the data voltage writing module is controlled to be turned on by a signal of the first scan line.

In a second aspect of the present disclosure, a method for driving a pixel driving circuit is provided. The pixel driving circuit includes a light-emitting module, a driving module, a power voltage writing module, a data voltage writing module, and a light-emitting control module. The driving module is configured to provide a light-emitting driving current for the light-emitting module and comprising an input terminal and an output terminal. The power voltage writing module includes a first input terminal, a first output terminal, and a first control terminal, the first input terminal is electrically connected to a power voltage signal line, and the first output terminal is electrically connected to the input terminal of the driving module. The data voltage writing module includes an input terminal electrically connected to a data voltage signal line, an output terminal electrically connected to the driving module, and a control terminal. The light-emitting control module includes a second input terminal, a second output terminal, and a second control terminal, the second input terminal is electrically connected to the output terminal of the driving module, and the second output terminal is electrically connected to the light-emitting module. The first control terminal of the power voltage writing module, the second control terminal of the light-emitting control module, and the control terminal of the data voltage writing module are electrically connected to a first scan line. The power voltage writing module and the light-emitting control module are controlled to be turned off when the data voltage writing module is controlled to be turned on by a signal of the first scan line. The method also includes: during a data voltage writing stage, transmitting a first control signal by the first scan line, controlling, by the first control signal, the data voltage writing module to be turned on, and controlling, by the first control signal, the power voltage writing module and the light-emitting control module to be turned off.

In a third aspect of the present disclosure, a display panel is provided. The display panel includes a pixel driving circuit. The pixel driving circuit includes a light-emitting module, a driving module, a power voltage writing module, a data voltage writing module, and a light-emitting control module. The driving module is configured to provide a light-emitting driving current for the light-emitting module and comprising an input terminal and an output terminal. The power voltage writing module includes a first input terminal, a first output terminal, and a first control terminal, the first input terminal is electrically connected to a power voltage signal line, and the first output terminal is electrically connected to the input terminal of the driving module. The data voltage writing module includes an input terminal electrically connected to a data voltage signal line, an output terminal electrically connected to the driving module, and a control terminal. The light-emitting control module includes a second input terminal, a second output terminal, and a second control terminal, the second input terminal is electrically connected to the output terminal of the driving module, and the second output terminal is electrically connected to the light-emitting module. The first control terminal of the power voltage writing module, the second control terminal of the light-emitting control module, and the control terminal of the data voltage writing module are electrically connected to a first scan line. The power voltage writing module and the light-emitting control module are controlled to be turned off when the data voltage writing module is controlled to be turned on by a signal of the first scan line.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

FIG. 10 is a flowchart of a method for driving a pixel driving circuit according to another embodiment of the present disclosure;

FIG. 11 is a timing sequence corresponding to the circuit shown in FIG. 4 according to another embodiment of the present disclosure;

FIG. 12 is a flowchart of a method for driving a pixel driving circuit according to another embodiment of the present disclosure;

DESCRIPTION OF EMBODIMENTS

In order to better understand the technical solutions of the present disclosure, the embodiments of the present disclosure are described in detail below with reference to the accompanying drawings.

It should be clear that the described embodiments are only a part of the embodiments of the present disclosure, but not all of the embodiments. Based on the embodiments in the present disclosure, all other embodiments obtained by those of ordinary skill in the art without creative efforts fall within the protection scope of the present disclosure.

The terms used in the embodiments of the present disclosure are only for the purpose of describing specific embodiments, and are not intended to limit the present disclosure. As used in the embodiments of this application and the appended claims, the singular forms "a," "the," and "the" are intended to include the plural forms as well, unless the context clearly dictates otherwise.

It should be understood that the term "and/or" used in this document is only an association relationship to describe the associated objects, indicating that there may be three relationships, for example, A and/or B, which may indicate that A alone, A and B, and B alone. The character "I" in this document generally indicates that the related objects are an "or" relationship.

In this specification, it should be understood that words such as "basically", "approximately", "about", "substantially" and "generally" described in the claims and embodiments of the present disclosure refer to a value within a reasonable technological operating ranges or tolerance ranges, which may be generally approved and is not a precise value.

It should be understood that although the terms 'first' and 'second' can be used in the present disclosure to describe scan lines and transistors, these scan lines and transistors should not be limited to these terms. These terms are used only to distinguish the scan lines and transistors from each other. For example, without departing from the scope of the embodiments of the present disclosure, a first transistor can also be referred to as a second transistor. Similarly, the second transistor can also be referred to as the first transistor.

Figure 1:
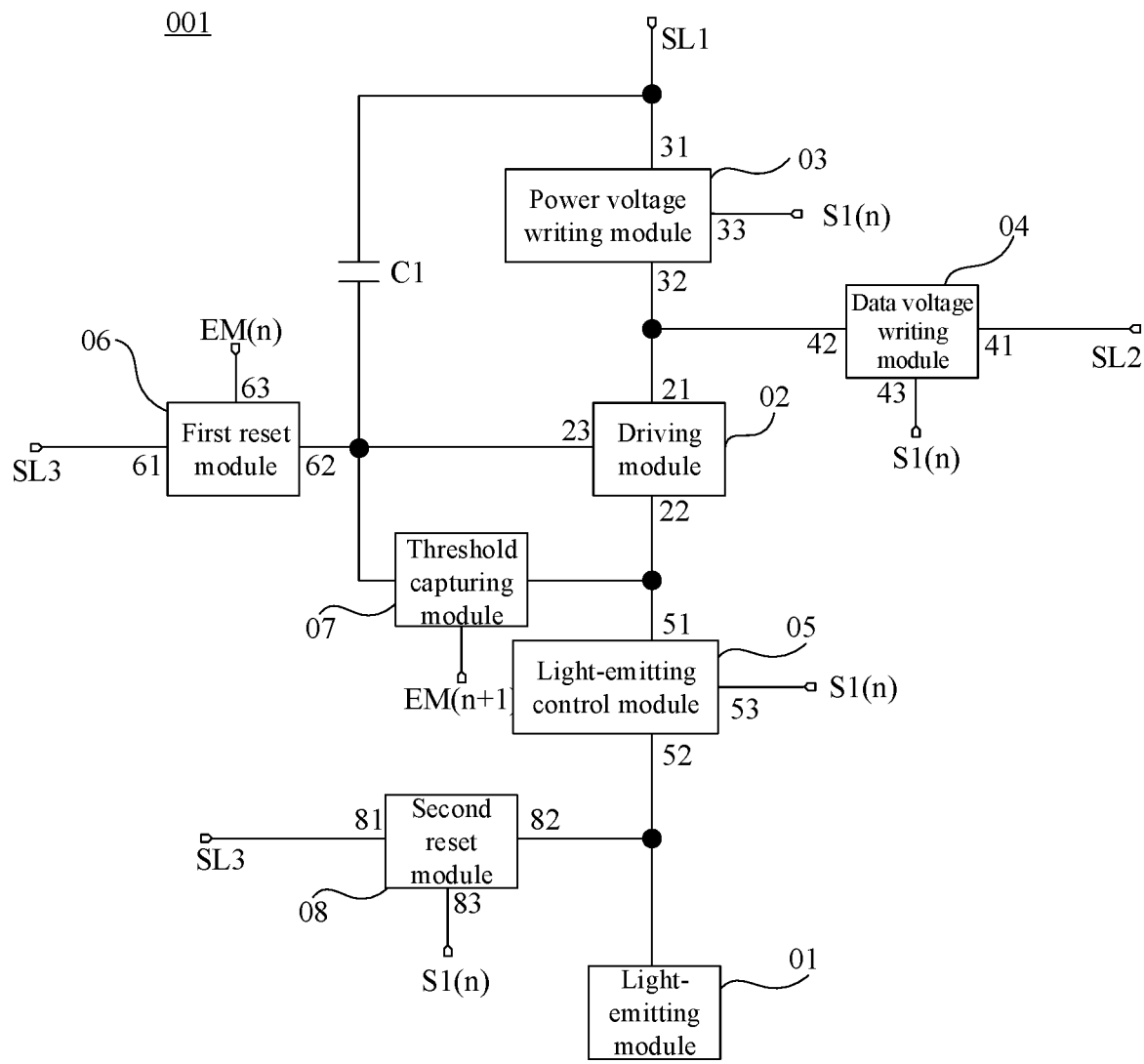
FIG. 1 is an equivalent circuit diagram of a pixel driving circuit according to an embodiment of the present disclosure.
Figure 2:
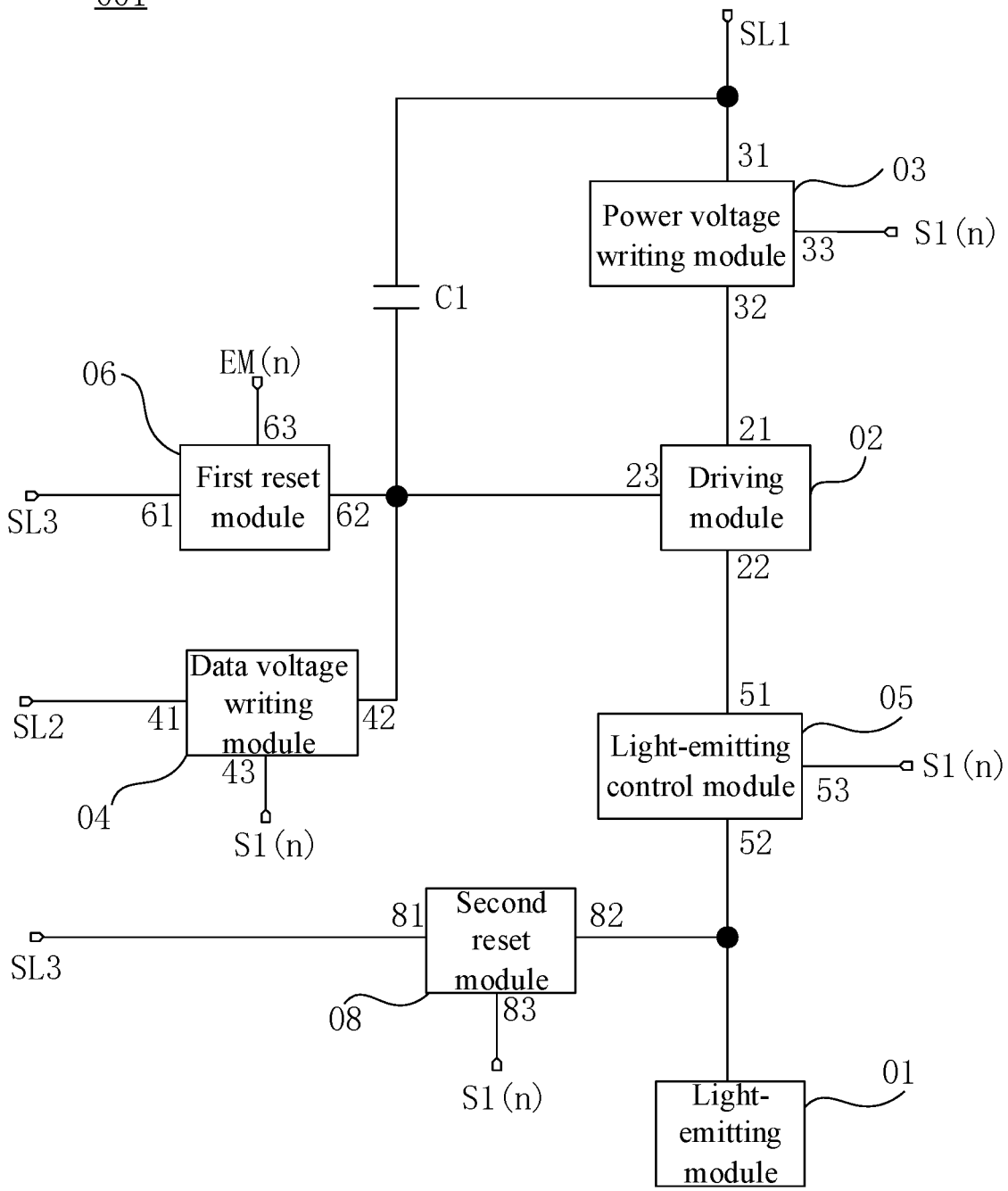
FIG. 2 is an equivalent circuit diagram of a pixel driving circuit according to another embodiment of the present disclosure.

FIG. 1 is an equivalent circuit diagram of a pixel driving circuit according to an embodiment of the present disclosure, and FIG. 2 is an equivalent circuit diagram of a pixel driving circuit according to another embodiment of the present disclosure.

As shown in FIG. 1 and FIG. 2, a pixel driving circuit 001 is provided. The pixel driving circuit 001 includes a light-emitting module 01, a driving module 02, a power voltage writing module 03, a data voltage writing module 04, and a light-emitting control module 05. The light-emitting module 01 is configured to emit light. The driving module 02 is configured to provide a light-emitting driving current for the light-emitting module 01.

The power voltage writing module 03 includes a first input terminal 31 and a first output terminal 32. The first input terminal 31 is electrically connected to a power voltage signal line SL1, and the first output terminal 32 is electrically connected to an input terminal 21 of the driving module 02. The power voltage writing module 03 is configured to input the power voltage signal VDD to the driving module 02. The power voltage writing module 03 further includes a first control terminal 33.

An input terminal 41 of the data voltage writing module 04 is electrically connected to a data voltage signal line SL2, and an output terminal 42 of the data voltage writing module 04 is electrically connected to the driving module 02. The data voltage writing module 04 is configured to input a data voltage signal Vdata to the driving module 02.

The light-emitting control module 05 includes a second input terminal 51 and a second output terminal 52. The second input terminal 51 is electrically connected to an output terminal 22 of the driving module 02, and the second output terminal 52 is electrically connected to the light-emitting module 01. The light-emitting control module 05 is configured to control a light-emitting driving current provided by the control driving module 02 to be input to the light-emitting module 01. The light-emitting control module 05 further includes a second control terminal 53.

As shown in FIG. 1, the output terminal 42 of the data voltage writing module 04 can be electrically connected to the input terminal 21 of the driving module 02. As shown in FIG. 2, the output terminal 42 of the data voltage writing module 04 can further be electrically connected to a control terminal 23 of the driving module 02.

The first control terminal 33 of the power voltage writing module 03, the second control terminal 53 of the light-emitting control module 05, and the control terminal 43 of the data voltage writing module 04 are electrically connected to the first scan line S1. When a signal of the first scan line S1 controls the data voltage writing module 04 to be turned on, the control power voltage writing module 03 and the light-emitting control module 05 are controlled to be turned off. That is to say, the data voltage writing module 04, the power voltage writing module 03, and the light-emitting control module 05 are not turned on simultaneously.

It can be understood that the pixel driving circuit 001 can further include other operating modules in addition to the light-emitting module 01, the driving module 02, the power voltage writing module 03, the data voltage writing module 04, and the light-emitting control module 05.

For example, as shown in FIG. 1 and FIG. 2, the pixel driving circuit 001 further includes a first reset module 06 for controlling a reset signal Vref to be input to the driving module 02. As shown in FIG. 1, the pixel driving circuit 001 can further include a threshold capturing module 07 configured to capture a threshold voltage.

In order to improve the stability of the pixel driving circuit 001, the first reset module 06 configured to control the reset signal Vref to be input to the driving module 02, and the threshold capturing module 07 configured to capture the threshold voltage can include a transistor including a metal oxide active layer. In the related art, when the pixel driving circuit includes both metal oxide active layer transistors and silicon-based active layer transistors, the number of scan lines in increased compared to the number of scan lines of a pixel driving circuit that only includes silicon-based active layer transistors. However, whether it is in the mass-produced products or in the product design in the related art, two sides perpendicular to the extension direction of the scan line need to have enough space to meet the requirements of the process etching, so as to avoid the problem of over-etching or incomplete etching caused by the limitation of the process etching accuracy. When one scan line is added for each row of pixel driving circuits 001, a certain space can be reserved at both sides of the scan line. Therefore, it is difficult to maintain a higher pixel density and meet regular design and production specifications.

A set of shift register circuits is usually added for an additional scan signal. In a layout design of the pixel driving circuit, the signal lines connected to the respective ports of the shift register circuit can be designed to be wider, and the output transistors of the shift register circuit can be designed to be relatively large to meet the requirements of outputting reliable scanning signals. That is to say, adding a set of shift register circuits can increase the width of the bezel of the display panel. However, the market demands narrow bezels. Therefore, the design in the related art cannot meet the requirements of many design specifications.

It can be understood that various functional modules in the pixel driving circuit 001 implement different functions, resulting in different turn-on time moments and different turn-on durations. Therefore, it is difficult for various functional modules to share a same scan signal line. Since silicon-based active layer transistors and oxide active-layer transistors are transistors with completely different characteristics of carrier mobility-based transistors, it is difficult to make two types of transistors to share the same scan signal line.

The power voltage writing module 03, the data voltage writing module 04, and the light-emitting control module 05 all act on the driving module 02. Although the power voltage writing module 03 and the light-emitting control module 05 are turned on simultaneously, in order to avoid competition and short circuit, the power voltage writing module 03 and the light-emitting control module 05 cannot be turned on simultaneously as the data voltage writing module 04, and their actual operating time are completely separate and cannot overlap. This exactly matches oppositely the on-off characteristics of P-type transistors and N-type transistors. The during in which the power voltage writing module 03 and the light-emitting control module 05 are turned off to be determined according to the width-to-length ratio, mobility of the data voltage writing module 04 and driving frequency of the display panel are to be achieved without other special design requirements. The mobility and width-to-length ratio design of the power voltage writing module 03 and the light-emitting control module 05 do not need to be related to their turn-off time, but can be related to the driving current design requirements. To sum up, the power voltage writing module 03, the light-emitting control module 05, and the data voltage writing module 04 can be designed independently without affecting each other.

Therefore, the first control terminal 33 of the power voltage writing module 03, the second control terminal 53 of the light-emitting control module 05, and the control terminal 43 of the data voltage writing module 04 are all electrically connected to the same first scan line S1, so that the number of scan lines configured to drive the pixel driving circuit 001 in the display panel, that is, the number of scan lines, does not need to be increased compared to a pixel driving circuit that only includes silicon-based active layer transistors. In the case of satisfying the electrical specifications and the optical specifications of the display panel, the space specification of the layout design of the pixel driving circuit in the display panel is satisfied simultaneously without increasing a size of the border of the display panel, thereby meeting user's demand for a narrow bezel.

Referring to FIG. 1 and FIG. 2, in an embodiment of the present disclosure, the pixel driving circuit 001 further includes a first reset module 06, an input terminal 61 of the first reset module 06 is electrically connected to the reset signal line SL3, an output terminal 62 of the first reset module 06 is electrically connected to a control terminal 23 of the driving module 02, and the first reset module 06 is configured to input a reset signal Vref to the control terminal of the driving module 02.

A control terminal 63 of the first reset module 06 is electrically connected to a second scan line EM. When the second scan line EM controls the first reset module 06 to be turned on, the data voltage writing module 04 is electrically insulated from the control terminal 23 of the driving module 02. That is to say, when the first reset module 06 is turned on, a data voltage signal Vdata will not be written into the control terminal 23 of the driving module 02.

In an embodiment, when the first reset module 06 is turned on, the data voltage writing module 04 is turned off. As shown in FIG. 1, when the first reset module 06 is turned on, although the data voltage writing module 04 is turned on, the data voltage writing module 04 is electrically connected to the input terminal 21 of the driving module 02. At this time, the threshold capturing module 07 is turned off.

Figure 3:
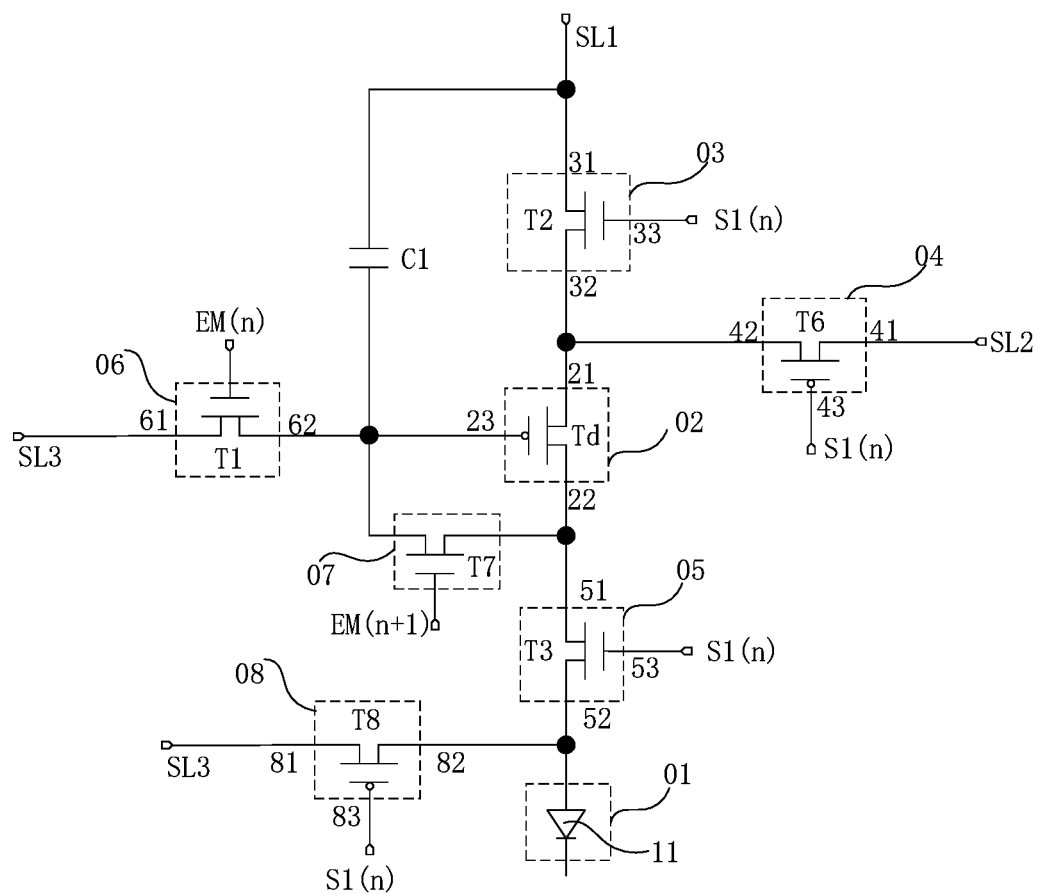
FIG. 3 is an equivalent circuit diagram of a pixel driving circuit according to another embodiment of the present disclosure.

FIG. 3 is an equivalent circuit diagram of a pixel driving circuit according to another embodiment of the present disclosure.

As shown in FIG. 3, in an embodiment of the present disclosure, the first reset module 06 includes a first transistor T1, a first electrode of the first transistor T1 is electrically connected to a reset signal line SL3, a second electrode of the first transistor T1 is electrically connected to the control terminal 23 of the driving module 02, and a gate of the first transistor T1 is electrically connected to the second scan line EM. That is to say, the first reset module 06 may include only one first transistor T1, and the first transistor T1 controls the reset signal Vref to be input to the control terminal of the driving module 02.

The first transistor T1 includes a metal oxide active layer.

The first transistor T1 can include an indium gallium zinc oxide (IGZO) active layer. Since the off-state leakage current of the oxide semiconductor transistor is low, the first transistor T1 is provided to reduce the leakage current of the reset current flowing to the control terminal of the driving module 02, thereby reducing the influence of the leakage current on the potential stability of the control terminal of the driving module 02, further improving the stability of the light-emitting driving current generated by the pixel driving circuit 001, thereby achieving the low-frequency driving of the pixel driving circuit 001.

In an embodiment of the present disclosure, referring to FIG. 3, the power voltage writing module 03 includes a second transistor T2. A gate of the second transistor T2 is electrically connected to the first scan line S1.

The light-emitting control module 05 includes a third transistor T3. A gate of the third transistor T3 is electrically connected to the first scan line S1.

An on-off state of the second transistor T2 controlled by the signal transmitted by the first scan line S1 is different from an on-off state of the data voltage writing module 04. An on-off state of the third transistor T3 controlled by the signal transmitted by the first scan line S1 is different from an on-off state of the data voltage writing module 04. That is to say, when the pixel driving circuit 001 is operating, the on-off state of the second transistor T2 and the on-off state of the third transistor T3 are the same, and are different from the on-off states of the data voltage writing module 04.

A channel type of the second transistor T2 and a channel type of the third transistor T3 can be the same. That is, both the second transistor T2 and the third transistor T3 can be N-type transistors or P-type transistors.

In an embodiment, the second transistor T2 and the third transistor T3 each include a metal oxide active layer.

In an embodiment of the present disclosure, referring to FIG. 3, the first electrode of the second transistor T2 is electrically connected to the power voltage signal line SL1, and the second electrode of the second transistor T2 is electrically connected to the input terminal 21 of the driving module 02. That is to say, the power voltage writing module 03 may only include one second transistor T2, and the second transistor T2 controls the power voltage signal VDD to be input to the driving module 02.

Figure 4:
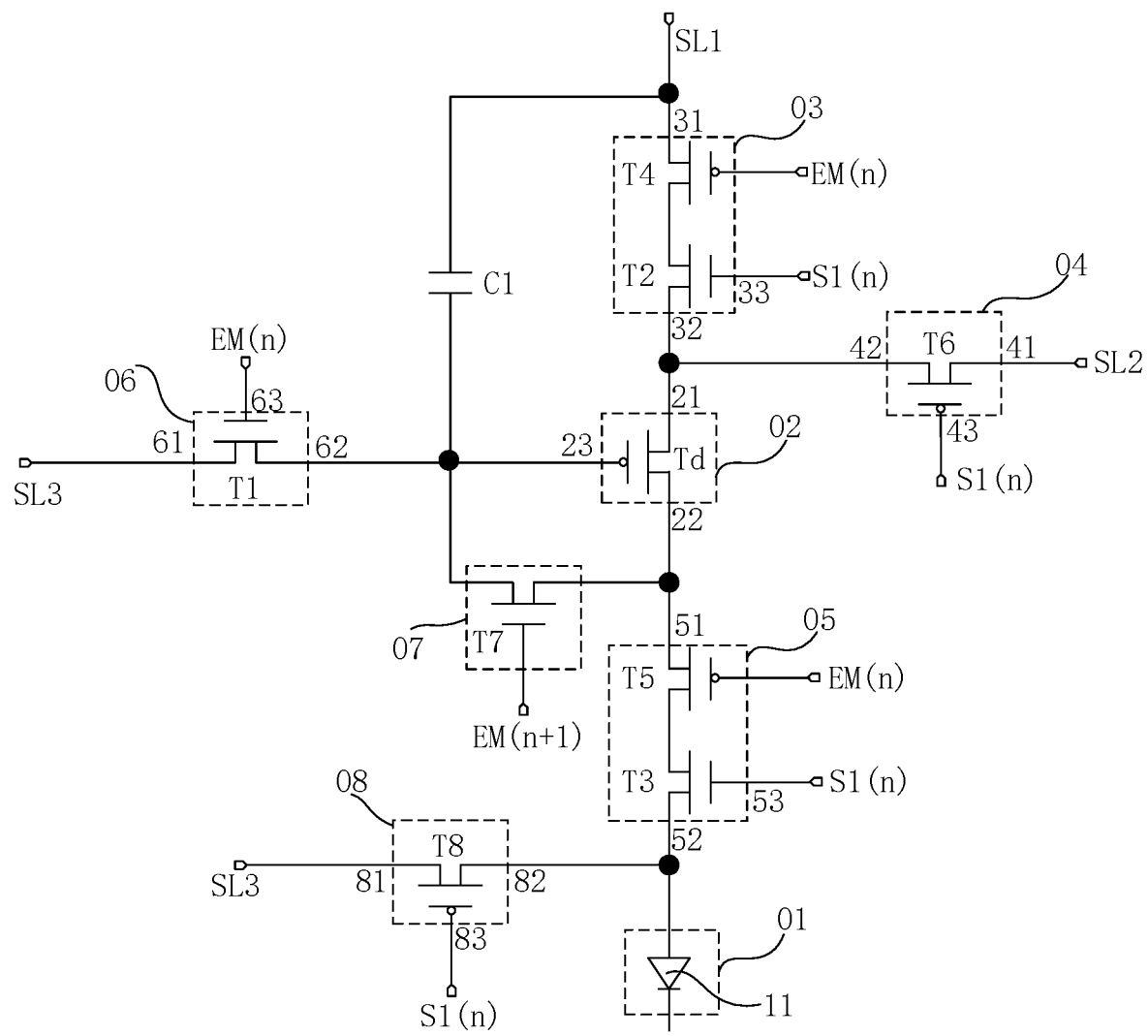
FIG. 4 is an equivalent circuit diagram of a pixel driving circuit according to another embodiment of the present disclosure.

FIG. 4 is an equivalent circuit diagram of a pixel driving circuit according to another embodiment of the present disclosure.

As shown in FIG. 4, in an embodiment of the present disclosure, the power voltage writing module 03 further includes a fourth transistor T4, and the fourth transistor T4 is connected in series with the second transistor T2. The first electrode of one of the second transistor T2 and the fourth transistor T4 is electrically connected to the power voltage signal line SL1, and the second electrode of the other of the second transistor T2 and the fourth transistor T4 is electrically connected to the input terminal 21 of the driving module 02. In an embodiment, the first electrode of the second transistor T2 is electrically connected to the power voltage signal line SL1, and the second electrode of the fourth transistor T4 is electrically connected to the input terminal 21 of the driving module 02. In an embodiment, the first electrode of the fourth transistor T4 is electrically connected to the power voltage signal line SL1, and the second electrode of the second transistor T2 is electrically connected to the input terminal 21 of the driving module 02.

For example, as shown in FIG. 4, the first electrode of the fourth transistor T4 is electrically connected to the power voltage signal line SL1, the second electrode of the fourth transistor T4 is electrically connected to the first electrode of the second transistor T2, and the second electrode of the second transistor T2 is electrically connected to the input terminal 21 of the driving module 02. In an embodiment, the first electrode of the second transistor T2 is electrically connected to the power voltage signal line SL1, the second electrode of the second transistor T2 is electrically connected to the first electrode of the fourth transistor T4, and the second electrode of the fourth transistor T4 is electrically connected to the input terminal 21 of the driving module 02.

That is, the power voltage writing module 03 can include a second transistor T2 and a fourth transistor T4 that are connected in series, and the second transistor T2 and the fourth transistor T4 jointly control the power voltage signal VDD to be input to the driving module 02.

The gate of the second transistor T2 is electrically connected to the first scan line S1, and the gate of the fourth transistor T4 is electrically connected to the second scan line EM. The on-off state of the second transistor T2 controlled by the signal transmitted by the first scan line S1 is different from the on-off state of the data voltage writing module 04. The on-off state of the fourth transistor T4 controlled by the signal transmitted by the second scan line EM is different from the on-off state of the first reset module 06.

Since the first reset module 06 can include only one first transistor T1, the channel type of the fourth transistor T4 can be different from the channel type of the first transistor T1.

In the embodiments of the present disclosure, the second transistor T2 and the data voltage writing module 04 share a same first scan line S1, and the fourth transistor T4 and the first reset module 06 share a same second scan line EM. Therefore, the number of control lines for driving the pixel driving circuit 001 in the display panel is reduced, that is, the number of scanning lines does not need to be increased compared to the pixel driving circuit that only includes silicon-based active layer transistors. In the case of satisfying the electrical specifications and the optical specifications of the display panel, the space specification of the layout design of the pixel driving circuit in the display panel is satisfied simultaneously. The width of the bezel of the display panel will not be increased, thereby meeting user's demand for a narrow bezel.

In an embodiment, the second transistor T2 includes a metal oxide active layer, and the channel width-to-length ratio of the active layer of the second transistor T2 is greater than the channel width-to-length ratio of the active layer of the fourth transistor T4, which can improve the carrier mobility of the second transistor T2 and meet the transmission requirements of the second transistor T2 for the power voltage signal VDD.

In an embodiment, the second transistor T2 includes a metal oxide active layer, and a distance between the gate and the active layer of the second transistor T2 is greater than a distance between the gate and the active layer of the fourth transistor T4. In this way, the carrier mobility of the second transistor T2 is improved, which meets the transmission requirements of the second transistor T2 for the power voltage signal VDD.

Referring to FIG. 3, in an embodiment of the present disclosure, the first electrode of the third transistor T3 is electrically connected to the output terminal 22 of the driving module 02, and the second electrode of the third transistor T3 is electrically connected to the light-emitting module 01. That is to say, the light-emitting control module 05 can include only one third transistor T3, and the third transistor T3 controls the light-emitting driving current provided by the driving module 02 to be input to the light-emitting module 01.

In an embodiment of the present disclosure, as shown in FIG. 4, the light-emitting control module 05 further includes a fifth transistor T5, and the third transistor T3 is connected in series to the fifth transistor T5. The first electrode of one of the third transistor T3 and the fifth transistor T5 is electrically connected to the output terminal 22 of the driving module 02, and the second electrode of the other one of the third transistor T3 and the fifth transistor T5 is electrically connected to the light-emitting module 01.

For example, as shown in FIG. 4, the first electrode of the fifth transistor T5 is electrically connected to the output terminal 22 of the driving module 02, the second electrode of the fifth transistor T5 is electrically connected to the first electrode of the third transistor T3, and the second electrode of the third transistor T3 is electrically connected to the light-emitting module 01. In another embodiment, the first electrode of the third transistor T3 is electrically connected to the output terminal 22 of the driving module 02, and the second electrode of the third transistor T3 is electrically connected to the first electrode of the fifth transistor T5, the second electrode of the fifth transistor T5 is electrically connected to the light-emitting module 01.

That is, the light-emitting control module 05 can include a third transistor T3 and a fifth transistor T5 that are connected in series. The third transistor T3 and the fifth transistor T5 jointly control the light-emitting driving current provided by the driving module 02 to be input to the light-emitting module 01.

The gate of the third transistor T3 is electrically connected to the first scan line S1, and the gate of the fifth transistor T5 is electrically connected to the second scan line EM. The on-off state of the third transistor T3 controlled by the signal transmitted by the first scan line S1 is different from the on-off state of the data voltage writing module 04, and the on-off state of the fifth transistor T5 controlled by the signal transmitted by the second scan line EM a is different from the on-off state of the first reset module 06.

Since the first reset module 06 can include only one first transistor T1, the channel type of the fifth transistor T5 can be different from the channel type of the first transistor T1.

In the embodiments of the present disclosure, the third transistor T3 and the data voltage writing module 04 share the same first scan line S1, and the fifth transistor T5 and the first reset module 06 share the same second scan line EM. Then, the number of control lines for driving the pixel driving circuit 001 in the display panel is reduced, so that this approach is beneficial to reducing the wiring in the border region of the display panel, and to simplifying the peripheral circuit for driving the pixel driving circuit 001 in the display panel, thereby achieving the narrow bezel of the display panel, reducing the difficulty of designing and manufacturing the circuit board of the display panel, and saving the manufacturing cost of the display panel.

In an embodiment, the third transistor T3 includes a metal oxide active layer, and the channel width-to-length ratio of the active layer of the third transistor T3 is greater than the channel width-to-length ratio of the active layer of the fifth transistor T5. In this way, the carrier mobility of the third transistor T3 is increased, and the transmission requirements of the third transistor T3 for the light-emitting driving current is met.

In an embodiment, the third transistor T3 includes a metal oxide active layer, and a distance between the gate and the active layer of the third transistor T3 is greater than a distance between the gate and the active layer of the fifth transistor T5. In this way, the carrier mobility of the third transistor T3 is increased, and the transmission requirements of the third transistor T3 for the light-emitting driving current is met.

Referring to FIG. 3 and FIG. 4, in an embodiment of the present disclosure, the data voltage writing module 04 includes a sixth transistor T6, a first electrode of the sixth transistor T6 is electrically connected to the data voltage signal line SL2, a second electrode of the sixth transistor T6 is electrically connected to the driving module 02, and a gate of the sixth transistor T6 is electrically connected to the first scan line S1. That is to say, the data voltage writing module 04 can only include one sixth transistor T6, and the sixth transistor T6 controls the data voltage signal Vdata to be input to the driving module 02.

The second electrode of the sixth transistor T6 can be electrically connected to the input terminal 21 of the driving module 02, and can also be electrically connected to the control terminal 23 of the driving module 02.

The channel type of the sixth transistor T6 is different from the channel types of the second transistor T2 and the channel type of the third transistor T3. That is to say, during the operation of the pixel driving circuit 001, the on-off state of the sixth transistor T6 is different from the on-off state of the second transistor T2 and the on-off state of the third transistor T3.

Figure 5:
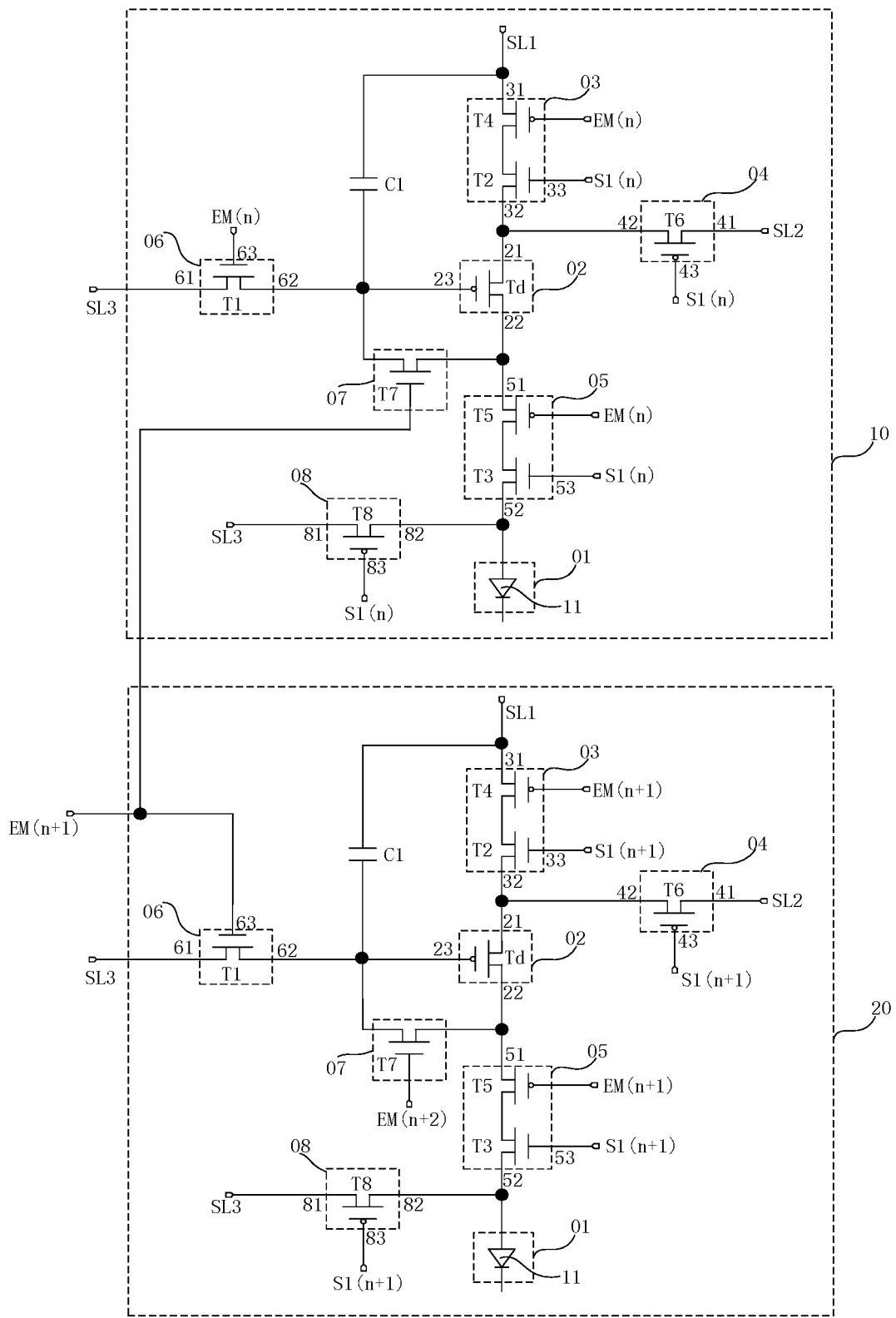
FIG. 5 is an equivalent circuit diagram of a pixel driving circuit according to another embodiment of the present disclosure.

FIG. 5 is an equivalent circuit diagram of a pixel driving circuit according to another embodiment of the present disclosure.

In an embodiment of the present disclosure, as shown in FIG. 3 and FIG. 4, the output terminal 42 of the data voltage writing module 04 is electrically connected to the input terminal 21 of the driving module 02, and the second electrode of the sixth transistor T6 can be electrically connected to the input terminal 21 of the driving module 02.

The driving module 02 can include a light-emitting driving transistor Td, a first electrode of the light-emitting driving transistor Td may be electrically connected to the input terminal 21 of the driving module 02, a second electrode of the light-emitting driving transistor Td can be electrically connected to the output terminal 22 of the driving module 02, and a gate of the light-emitting driving transistor Td can be electrically connected to the control terminal 23 of the driving module 02.

The pixel driving circuit 001 can further include a seventh transistor T7, a first electrode of the seventh transistor T7 is electrically connected to the output terminal 22 of the driving module 02, a second electrode of the seventh transistor T7 is electrically connected to the control terminal 23 of the driving module 02, and a gate of the seven transistor T7 is electrically connected to the second scan line EM. That is, the seventh transistor T7 can be configured to capture the threshold voltage.

It can be understood that the display panel includes multiple pixel driving circuits 001 that can be arranged in an array along a row direction and a column direction in the display panel. The pixel driving circuits 001 that are arranged in the same row can be connected to the same first scan line S1 and the same second scan line EM.

In an embodiments of the present disclosure, the first scan line S1 electrically connected to the data voltage writing module 04 in the pixel driving circuit 001 in an $n^{th}$ row is defined as the first scan line S1($n$), and the second scan line EM electrically connected to the first reset module 06 in the pixel driving circuit 001 in the $n^{th}$ row is defined as a second scan line EM(n), where n is a positive integer greater than or equal to 1.

In an embodiment of the present disclosure, among the seventh transistor T7 and the first transistor T1 that are electrically connected to the same second scan line EM, the time moment when the pixel driving circuit 001 including the seventh transistor T7 generates the light-emitting driving current is earlier than the time moment when the pixel driving circuit 001 including the first transistor T1 generates the light-emitting drive current. It can be understood that the seventh transistor T7 in the pixel driving circuit 001 in the $n^{th}$ row can be connected to the same second scan line EM with the first transistor T1 in the pixel driving circuit 001 in the $(n+1)^{th}$ row. That is, the second scan line EM connected to the seventh transistor T7 in the pixel driving circuit 001 in the $n^{th}$ row can be the second scan line EM (n+1) connected to the first transistor T1 in the pixel driving circuit 001 in the $(n+1)^{th}$ row.

Exemplarily, as shown in FIG. 5, multiple pixel driving circuits 001 include a first pixel driving circuit 10 and a second pixel driving circuit 20 that are arranged in a column direction, and the time moment when the second pixel driving circuit 20 generates a light-emitting driving current is later than the time moment when the first pixel driving circuit 10 generates the light-emitting driving current. The second scan line EM electrically connected to the gate of the first transistor T1 in the first pixel driving circuit 10 is a second scan line EM(n), and second scan line EM electrically connected to the gate of the first transistor T1 in the second pixel driving circuit 10 is a second scan line EM(n+1). Therefore, the second scan line EM electrically connected to the gate of the seventh transistor T7 in the first pixel driving circuit 10 is the second scan line EM(n+1).

The channel type of the seventh transistor T7 is the same as the channel type of the first transistor T1.

In an embodiment, the seventh transistor T7 includes a metal oxide active layer.

The third transistor T7 can include an indium gallium zinc oxide (IGZO) active layer. Since the off-state leakage current of the oxide semiconductor transistor is low, the seventh transistor T7 is provided to reduce the leakage current of the light-emitting driving current flowing to the control terminal of the driving module 02, thereby reducing the influence of the leakage current on the potential stability of the control terminal of the driving module 02, further improving the stability of the light-emitting driving current generated by the pixel driving circuit 001, thereby achieving the low-frequency driving of the pixel driving circuit 001.

Referring to FIG. 1 and FIG. 2, in an embodiment of the present disclosure, the pixel driving circuit 001 further includes a second reset module 08, an input terminal 81 of the second reset module 08 is electrically connected to the reset signal line SL3, an output terminal 82 of the second reset module 08 is electrically connected to the light-emitting module 01, and a control terminal 83 of the second reset module 08 is electrically connected to the first scan line S1. That is to say, the second reset module 08 is configured to transmit a reset signal Vref to the light-emitting module 01.

The second reset module 08 and the first reset module 06 can be connected to the same reset signal line SL3.

The on-off state of the second reset module 08 controlled by the signal transmitted by the first scan line S1 is the same as that of the data voltage writing module 04. That is, the data voltage writing module 04 and the second reset module 08 can be turned on and turned off simultaneously.

In the embodiments of the present disclosure, the second reset module 08 and the data voltage writing module 04 share the same first scan line S1, so that the number of control lines configured to drive the pixel driving circuit 001 in the display panel is further reduced, and it is beneficial to further reducing the wiring in the border region of the display panel, and simplifies the peripheral circuit for driving the pixel driving circuit 001 in the display panel, thereby achieving the narrow bezel of the display panel, reducing the difficulty of designing and manufacturing the circuit board of the display panel.

In an embodiment of the present disclosure, as shown in FIG. 3 and FIG. 4, the second reset module 08 includes an eighth transistor T8, a first electrode of the eighth transistor T8 is electrically connected to the reset signal line SL3, a second electrode of the eighth transistor T8 is electrically connected to the light-emitting module 01, and a gate of the eighth transistor T8 is electrically connected to the first scan line S1. That is to say, the second reset module 08 can include only one eighth transistor T8, and the eighth transistor T8 controls the reset signal Vref to be input to the light-emitting module 01.

The light-emitting module 01 can include the light-emitting device 11. In an embodiment, the light-emitting device 11 is an organic light-emitting diode, and the eighth transistor T8 controls the reset signal Vref to be input to the anode of the organic light-emitting diode.

The channel type of the eighth transistor T8 is the same as the channel type of the sixth transistor T6. Therefore, during the operation of the pixel driving circuit 001, the on-off state of the eighth transistor T8 is the same as that of the sixth transistor T6.

The pixel driving circuit 001 can further include a first capacitor C1, a first electrode plate of the first capacitor C1 is electrically connected to the power voltage signal line SL1, and a second electrode plate of the first electrode C1 is electrically connected to the gate of the light-emitting driving transistor Td.

Figure 6:
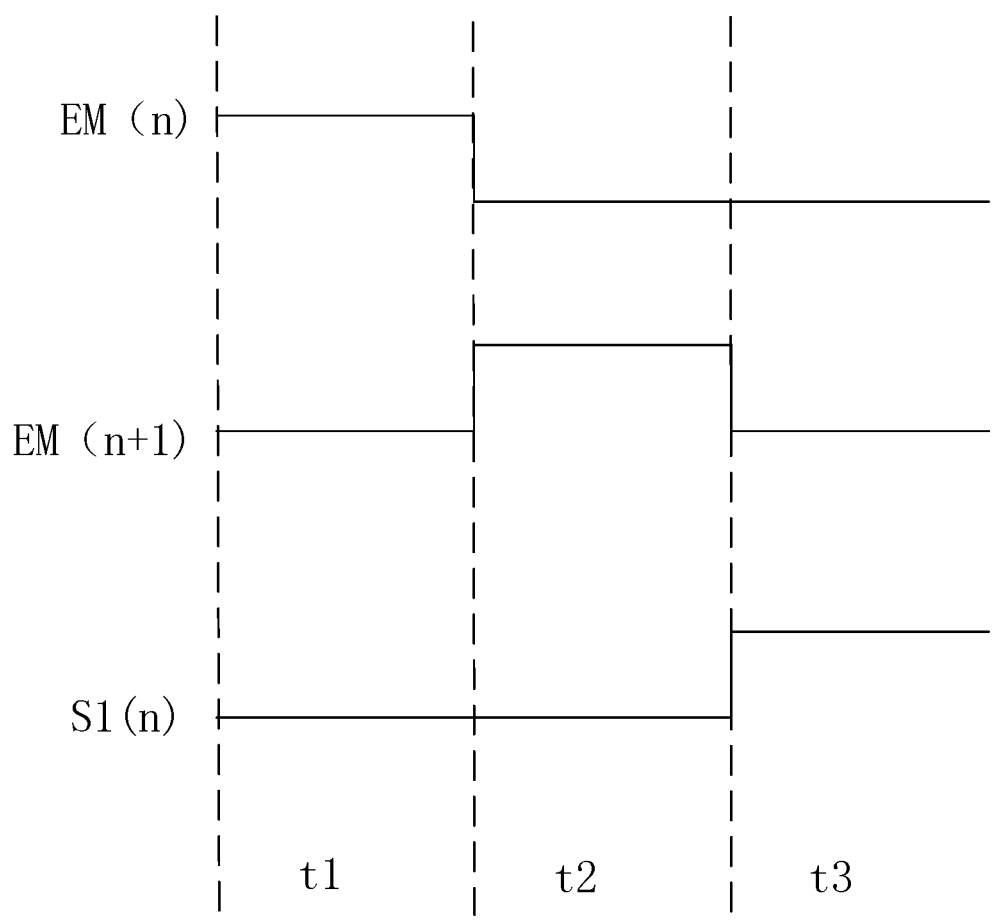
FIG. 6 is a timing sequence corresponding to the circuit shown in FIG. 3 according to an embodiment of the present disclosure.

FIG. 6 is a timing sequence corresponding to the circuit shown in FIG. 3. The operating principle of the pixel driving circuit 001 of the embodiment corresponding to FIG. 3 will be described below with reference to FIG. 3 and FIG. 6. The pixel driving circuit 001 provided by the embodiments of the present disclosure can be used for organic light-emitting display. During the operation of the organic light-emitting display, an operating time period of the pixel driving circuit 001 includes a plurality of cycles, and each cycle sequentially includes a reset stage t1, a data signal writing stage t2, and a light-emitting stage t3.

The following discussion takes the pixel driving circuit 001 in the $n^{th}$ row in the display panel as an example, and exemplarily, the first transistor T1, the second transistor T2, the third transistor T3, and the seventh transistor T7 are N-type transistors, and the sixth transistor T6, and the eighth transistor T8 are P-type transistors as an example for description. It is appreciated that, any one of the first transistor T1, the second transistor T2, the third transistor T3, and the seventh transistor T7 can also be a P-type transistor, and any one of the sixth transistor T6 and the eighth transistor T8 can also be an N-type transistor.

During the reset stage t1, the second scan line EM(n) receives a high level signal, that is, a turn-on signal, and the first transistor T1 is turned on; the second scan line EM(n+1) receives a low level signal, that is, a turn-off signal, and the seven transistors T7 is turned off; the first scan line S1(n) receives a low level signal, the sixth transistor T6 and the eighth transistor T8 are turned on, and the second transistor T2 and the third transistor T3 are turned off. Meanwhile, the reset signal line SL3 transmits the reset signal Vref that is a low level signal, and the reset signal Vref reaches the gate of the light-emitting driving transistor Td through the turned on first transistor T1, so as to reset the light-emitting driving transistor Td. The reset signal Vref reaches the light-emitting device 11 through the turned on eighth transistor T8, so as to reset the light-emitting device 11. In an embodiment, the light-emitting device 11 is an organic light-emitting diode, and the reset signal Vref resets the anode of the light-emitting device 11 through the turned-on eighth transistor T8.

Since the gate of the light-emitting driving transistor Td is electrically connected to the second electrode plate of the first capacitor C1, a potential of the gate of the light-emitting driving transistor Td is the same as the reset signal Vref in the reset stage t1.

It can be understood that, during the reset stage t1, although the sixth transistor T6 is in an on state, and the first electrode of the sixth transistor T6 is electrically connected to the data voltage signal line SL2, however, since the second transistor T2, the third transistor T3 and the seven transistors T7 each are turned off, so the data voltage signal Vdata does not affect the pixel driving circuit 001 in the reset stage t1.

During the data voltage writing stage t2, the second scan line EM(n) receives a low level signal, that is, a turn-off signal, and the first transistor T1 is turned off; the second scan line EM(n+1) receives a high level signal, that is, a turn-on signal, and the seventh transistor T7 is turned on; the first scan line S1(n) receives a low level signal, the sixth transistor T6 and the eighth transistor T8 are turned on, and the second transistor T2 and the third transistor T3 are turned off. Meanwhile, the data voltage signal line SL2 transmits the data voltage signal Vdata.

At the beginning of the data voltage writing stage t2, the potential of the gate of the light-emitting driving transistor Td is the reset signal Vref, the potential of the first electrode the light-emitting driving transistor Td is the data voltage signal Vdata, and a potential difference between the first electrode and the gate of the light-emitting driving transistor Td is (Vdata-Vref) which is greater than 0. Therefore, the light-emitting driving transistor Td is turned on, and the data voltage signal Vdata is transmitted to the gate of light-emitting driving transistor Td through the first and second electrodes of the turned-on light-emitting driving transistor Td and the turned-on seventh transistor T7, so that the potential of the gate of the light-emitting driving transistor Td is gradually increased. When the potential of the gate of the light-emitting driving transistor Td is equal to (Vdata−|Vth|), the light-emitting driving transistor Td is turned off.

At this time, due to the presence of the first capacitor C1, in the data voltage writing stage t2, the potential of the gate of the light-emitting driving transistor Td is maintained at (Vdata−|Vth|), where Vth is a threshold voltage of the light-emitting driving transistor Td.

It can be understood that, in the data voltage writing stage t2, although the eighth transistor T8 is in an on state, and the first electrode of the eighth transistor T2 is electrically connected to the reset signal line SL3, since the second transistor T2 and the third transistor T3 are in an off state, the reset signal Vref transmitted by the reset signal line SL3 only resets the light-emitting device 11 and has no effect on writing of the data voltage of the pixel driving circuit 001.

During the light-emitting stage t3, the second scan line EM(n) receives a low level signal, that is, a turn-off signal, and the first transistor T1 is turned off; the second scan line EM(n+1) receives a low level signal, that is, a turn-off signal, and the seven transistors T7 is turned off. The first scan line S1(n) receives a high level signal, the sixth transistor T6 and the eighth transistor T8 are turned off, and the second transistor T2 and the third transistor T3 are turned on. Meanwhile, the power voltage signal line SL1 transmits the power voltage signal VDD, that is, the potential of the first electrode of the light-emitting driving transistor Td is the power voltage signal VDD. Since the potential of the power voltage signal VDD is greater than the potential of the data voltage signal Vdata, the light-emitting driving transistor Td generates a light-emitting driving current and transmits it to the light-emitting device 11 through the third transistor T3, so as to control the light-emitting device 11 to emit light.

Figures 7, 8:
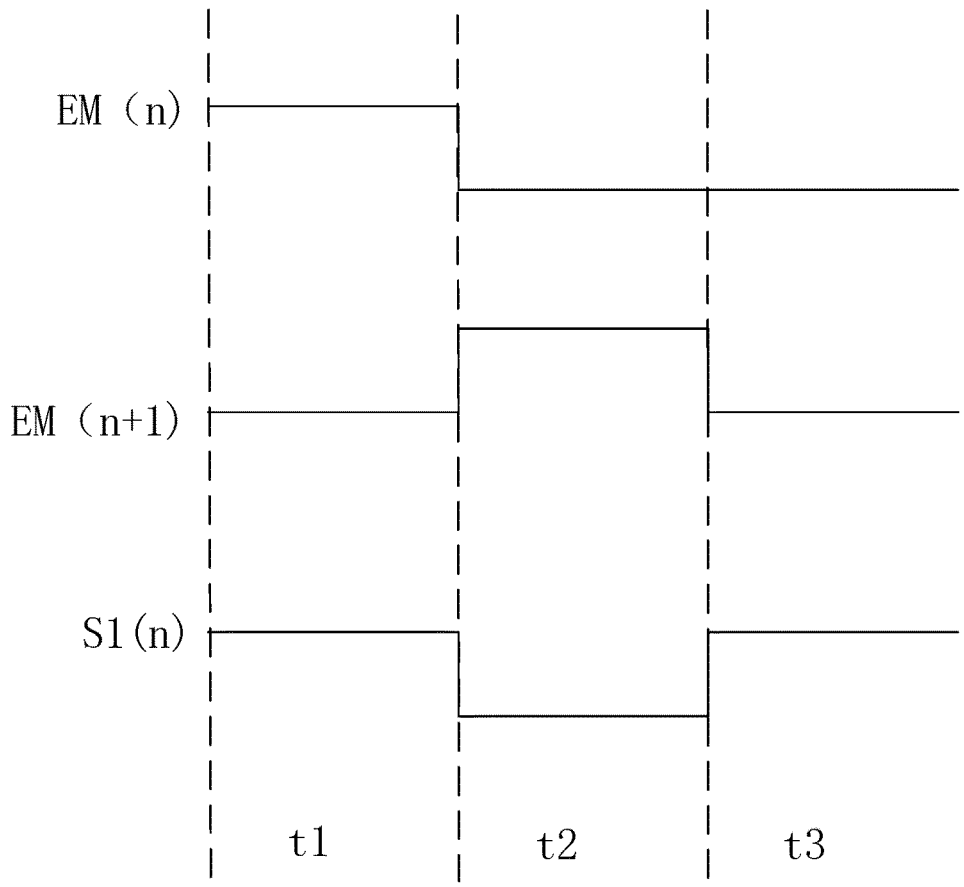
FIG. 7 is a timing sequence corresponding to the circuit shown in FIG. 4 according to an embodiment of the present disclosure.
FIG. 8 is a flowchart of a method for driving a pixel driving circuit according to an embodiment of the present disclosure.

FIG. 7 is a timing sequence corresponding to the circuit shown in FIG. 4.

In an embodiment of the present disclosure, the pixel driving circuit 001 shown in FIG. 4 differs from the pixel driving circuit 001 shown in FIG. 3 as follows.

The pixel driving circuit 001 shown in FIG. 4 is provided with a fourth transistor T4 connected in series with the second transistor T2, a gate of the fourth transistor T4 and the gate of the first transistor T1 are connected to the same second scan line EM(n), and the channel type of the fourth transistor T4 is different from the channel type of the first transistor T1.

The pixel driving circuit 001 shown in FIG. 4 is further provided with a fifth transistor T5 connected in series with the third transistor T2, and a gate of the fifth transistor T5 and the gate of the first transistor T1 are connected to the same second scan line EM(n), and the channel type of the fifth transistor T5 is different from the channel type of the first transistor T1.

The operating principle of the pixel driving circuit 001 of the embodiments corresponding to FIG. 4 will be described below with reference to FIG. 4 and FIG. 7.

During the reset stage t1, the second scan line EM(n) receives a high level signal, the first transistor T1 is turned on, the fourth transistor T4 and the fifth transistor T5 are turned off; the second scan line EM(n+1) receives a low level signal, i.e., a turn-off signal, the seventh transistor T7 is turned off; the first scan line S1(n) receives a high level signal, the sixth transistor T6 and the eighth transistor T8 are turned off, and the second transistor T2 and the third transistor T3 are turned on. Meanwhile, the reset signal line SL3 transmits the reset signal Vref being a low level signal, and the reset signal Vref reaches the gate of the light-emitting driving transistor Td through the turned on first transistor T1, so as to reset the light-emitting driving transistor Td.

Since the gate of the light-emitting driving transistor Td is electrically connected to the second electrode plate of the first capacitor C1, the potential of the gate of the light-emitting driving transistor Td is the same as the reset signal Vref in the reset stage t1.

It can be understood that, during the reset stage t1, although the second transistor T2 and the third transistor T3 are turned on, since the fourth transistor T4 and the fifth transistor T5 are turned off, the power voltage signal VDD may not be transmitted to the light-emitting driving transistor Td, without having an effect on the pixel driving circuit 001 in the reset stage t1.

During the data voltage writing stage t2, the second scan line EM(n) receives a low level signal, that is, a turn-off signal, the first transistor T1 is turned off, the fourth transistor T4 and the fifth transistor T5 are turned on; the second scan line EM(n+1) receives a high level signal, that is, a turn-on signal, the seventh transistor T7 is turned on; the first scan line S1(n) receives a low level signal, the sixth transistor T6 and the eighth transistor T8 are turned on, and the second transistor T2 and the third transistor T3 are turned off. Meanwhile, the data voltage signal line SL2 transmits the data voltage signal Vdata.

At the beginning of the data voltage writing stage t2, a potential of the gate of the light-emitting driving transistor Td is the reset signal Vref, a potential of the first electrode of the light-emitting driving transistor Td is the data voltage signal Vdata, and a potential difference between the first electrode and the gate of the light-emitting driving transistor Td is (Vdata-Vref), which is greater than 0. Therefore, the light-emitting driving transistor Td is turned on, and the data voltage signal Vdata is transmitted to the gate of the driving transistor Td through the first and second electrodes of the turned-on light-emitting driving transistor Td and the turned-on seventh transistor T7, so that the potential of the gate of the light-emitting driving transistor Td is gradually increased. When the potential of the gate of the light-emitting driving transistor Td is equal to (Vdata−|Vth|), the light-emitting driving transistor Td is turned off. At this time, due to the presence of the first capacitor C1, the potential of the gate of the light-emitting driving transistor Td is maintained at (Vdata−|Vth|) in the data voltage writing stage t2, where Vth is a threshold voltage of the light-emitting driving transistor Td.

Meanwhile, the reset signal line SL3 transmits the reset signal Vref the is a low level signal, and the reset signal Vref reaches the light-emitting device 11 through the turned on eighth transistor T8 to complete the reset of the light-emitting device 11. In an embodiment, the light-emitting device 11 is an organic light-emitting diode, and the reset signal Vref resets a positive electrode of the light-emitting device 11 through the turned-on eighth transistor T8.

It can be understood that, during the data voltage writing stage t2, although the fourth transistor T4 and the fifth transistor T5 are turned on, since the second transistor T2 and the third transistor T3 are turned off, the power voltage signal VDD cannot be transmitted to the light-emitting driving transistor Td, and does not affect writing of the data voltage of the pixel driving circuit 001. The reset signal Vref transmitted by the reset signal line SL3 cannot transmitted to the light-emitting driving transistor Td, and only resets the light-emitting device 11 and does not affect writing of the data voltage of the pixel driving circuit 001.

During the light-emitting stage t3, the second scan line EM(n) receives a low level signal, that is, a turn-off signal, the first transistor T1 is turned off, the fourth transistor T4 and the fifth transistor T5 are turned on; the second scan line EM(n+1) receives a low level signal, that is, a turn-off signal, the seventh transistor T7 is turned off; the first scan line S1(n) receives a high level signal, the sixth transistor T6 and the eighth transistor T8 are turned off, and the second transistor T2 and the third transistor T3 are turned on. Meanwhile, the power voltage signal line SL1 transmits the power voltage signal VDD, that is, the potential of the first electrode of the light-emitting driving transistor Td is the power voltage signal VDD. Since the potential of the power voltage signal VDD is greater than that of the data voltage signal Vdata, the light-emitting driving transistor Td generates a light-emitting driving current and transmits it to the light-emitting device 11 through the third transistor T3 so as to control the light-emitting device 11 to emit light.

It can be seen from the operating processes of the pixel drive circuit 001 shown in FIG. 3 and FIG. 4 that the power voltage writing module 03 and the light-emitting control module 05 cannot be turned on simultaneously as the data voltage writing module 04, and their operating times can be completely separated and cannot overlapped. That is, when the data voltage writing module 04 is turned on, the power voltage writing module 03 and the light-emitting control module 05 are turned off. The on-off time of the power voltage writing module 03 and the light-emitting control module 05 has no special design requirements, and the turn-on time thereof can be determined according to only the width-to-length ratio, mobility of the data voltage writing module 04, and driving frequency of the display panel to be achieved.

During the pixel driving circuit 001 shown in FIG. 3 and FIG. 4, the turn-on time of the sixth transistor T6 in the data voltage writing module 04 is controlled by the capacitance of the first capacitor C1, the mobility of the sixth transistor T6 and the writing speed of the data voltage under low frequency driving, and is controlled by the leakage current of the sixth transistor T6 under low frequency driving. Therefore, the leakage current of the sixth transistor T6 under low-frequency driving can define the first capacitor C1, and then the first capacitor C1 define the turn-on time of the sixth transistor T6 under high-frequency driving, and then the pulse width that drives the sixth transistor T6 to be turned on can be determined according to the final load to be driven and the delay outflow effect. That is, the duration in which the first scan line S1(n) receives the low level signal is determined.

After the turn-on pulse width of the sixth transistor T6 is determined, there is no special requirement to determine the turn-off time of the corresponding second transistor T2 and the third transistor T3, as long as they can withstand the voltage across two terminals without being broken down. Therefore, the mobility and width-to-length ratio design of the second transistor T2 and the third transistor T3 do not related to their turn-off time, but only related to design requirements for the driving current.

In the embodiments of the present disclosure, the channel width-to-length ratio of the second transistor T2 is designed to be larger, and the distance between gate and the active layer of the second transistor T2 is designed to be larger according to the coupling requirements, so as to meet the requirements for transmission of the power voltage signal VDD by the second transistor T2 when the display panel emits light. Simultaneously, the channel width-to-length ratio of the third transistor T3 is designed to be larger, and the distance between gate and the active layer of the third transistor T3 is designed to be larger according to the coupling requirements, so as to meet the requirements for transmission of the light-emitting driving current by the third transistor T3.

In the embodiments of the present disclosure, while meeting the design requirements of the second transistor T2 and the third transistor T3, the design of the sixth transistor T6 is not affected. The designs of the two are completely independent from each other and will not affect each other, which greatly reduces the design difficulty without making any design trade-offs and compromises therebetween.

The pixel driving circuit 001 provided by the embodiments of the present disclosure can perform the driving through only the first scan line S1(n), the second scan line EM(n), and the second scan line EM(n+1). The second scan lines EM(n) and the second scan line EM(n+1) can be provided by the same shift register circuit. That is to say, the pixel driving circuit 001 provided by the embodiments of the present disclosure can include only two sets of shift register circuits. In the case of satisfying the electrical specifications and the optical specifications of the display panel, the space specification of the layout design of the pixel driving circuit in the display panel is satisfied simultaneously. The width of the bezel of the display panel will not be increased, thereby meeting the user's demand for a narrow border.

FIG. 8 is a flowchart of a method for driving a pixel driving circuit according to an embodiment of the present disclosure.

The present disclosure provides a method for driving the pixel driving circuit 001 as mentioned in the above embodiments. As shown in FIG. 1 and FIG. 2, the pixel driving circuit 001 includes a light-emitting module 01, a driving module 02, a power voltage writing module 03, a data voltage writing module 04, and a light-emitting control module 05. The light-emitting module 01 is configured to emit light, and the driving module 02 is configured to provide the light-emitting module 01 with a light-emitting driving current.

The power voltage writing module 03 includes a first input terminal 31 and a first output terminal 32. The first input terminal 31 is electrically connected to the power voltage signal line SL1, and the first output terminal 32 is electrically connected to the input terminal 21 of the driving module 02. The power voltage writing module 03 is configured to input the power voltage signal VDD to the driving module 02. The power voltage writing module 03 includes a first control terminal 33.

An input terminal 41 of the data voltage writing module 04 is electrically connected to the data voltage signal line SL2, and an output terminal 42 of the data voltage writing module 04 is electrically connected to the driving module 02. The data voltage writing module 04 is configured to input a data voltage signal Vdata to the driving module 02.

The light-emitting control module 05 includes a second input terminal 51 and a second output terminal 52. The second input terminal 51 is electrically connected to an output terminal 22 of the driving module 02, and the second output terminal 52 is electrically connected to the light-emitting module 01. The light-emitting control module 05 is configured to input a light-emitting driving current provided by the control driving module 02 to the light-emitting module 01. The light-emitting control module 05 includes a second control terminal 53.

As shown in FIG. 1, the output terminal 42 of the data voltage writing module 04 can be electrically connected to the input terminal 21 of the driving module 02. As shown in FIG. 2, the output terminal 42 of the data voltage writing module 04 can also be electrically connected to the control terminal 23 of the driving module 02.

The first control terminal 33 of the power voltage writing module 03, the second control terminal 53 of the light-emitting control module 05, and the control terminal 43 of the data voltage writing module 04 are electrically connected to the first scan line S1.

As shown in FIG. 8, a method for driving a pixel driving circuit includes a data voltage writing stage t2.

During the data voltage writing stage t2, the first scan line S1 transmits a first control signal, the first control signal controls the data voltage writing module 04 to be turned on and controls the power voltage writing module 03 and the light-emitting control module 05 to be turned off.

In an embodiment of the method for driving the pixel driving circuit, referring to FIG. 3 and FIG. 6, the power voltage writing module 03 can include only one second transistor T2, and the gate of the second transistor T2 can be the first control terminal 33 of the power voltage writing module 03; the light-emitting control module 05 can include only a third transistor T3, and the gate of the third transistor T3 can be the second control terminal 53 of the light-emitting control module 05; the data voltage writing module 04 can include only one sixth transistors T6, and the gate of the sixth transistor T6 can be the control terminal 43 of the data voltage writing module 04. The channel types of the second transistor T2 and the third transistor T3 are the same, and are different from the channel type of the sixth transistor T6. For example, the second transistor T2 and the third transistor T3 are N-type transistors, and the sixth transistor T6 is a P-type transistor.

During the data voltage writing stage t2, when the first scan line S1 transmits a low level signal, the sixth transistor T6 is turned on, and the second transistor T2 and the third transistor T3 are turned off. That is, during the data voltage writing stage t2, the first scan line S1 transmits the first control signal, the first control signal controls the data voltage writing module 04 to be turned on and controls the power voltage writing module 03 and the light-emitting control module 05 to be turned off.

The second transistor T2 and the third transistor T3 can be P-type transistors, and the sixth transistor T6 can be an N-type transistor.

The power voltage writing module 03 can further include other transistors connected in series to the second transistor T2, and the light-emitting control module 05 can further include other transistors connected in series to the third transistor T3.

Figure 9:
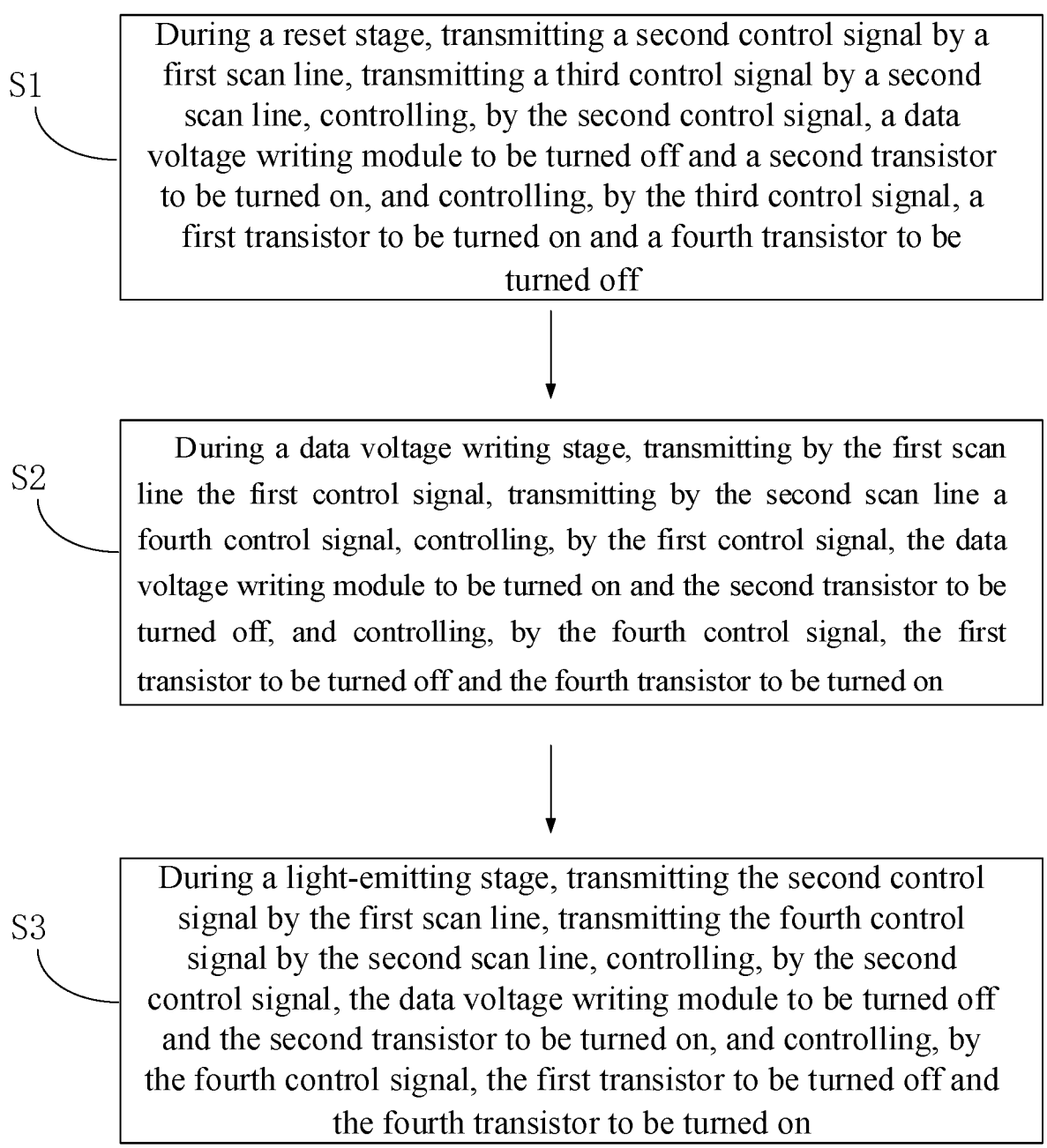
FIG. 9 is a flowchart of a method for driving a pixel driving circuit according to another embodiment of the present disclosure.

FIG. 9 is a flowchart of a method for driving a pixel driving circuit according to another embodiment of the present disclosure.

Referring to FIG. 4, in an embodiment of the present disclosure, the pixel driving circuit 001 further includes a first transistor T1, a first electrode of the first transistor T1 is electrically connected to the reset signal line SL3, and a second electrode of the first transistor T1 is electrically connected to the control terminal 23 of the driving module 02, and the gate of the first transistor T1 is electrically connected to the second scan line EM.

The power voltage writing module 03 includes a second transistor T2 and a fourth transistor T4 that are connected in series. A gate of the second transistor T2 is electrically connected to the first scan line S1, and a gate of the fourth transistor T4 is electrically connected to the second scan line EM. A first electrode of one of the second transistor T2 and the fourth transistor T4 is electrically connected to the power voltage signal line SL1, and a second electrode of the other of the second transistor T2 and the fourth transistor T4 is electrically connected to an input terminal 21 of the driving module 02.

That is, the power voltage writing module 03 can include a second transistor T2 and a fourth transistor T4 that are connected in series, and the second transistor T2 and the fourth transistor T4 jointly control the power voltage signal VDD to be input to the driving module 02.

As shown in FIG. 9, the method for driving a pixel driving circuit further includes steps step S1, step S2, and Step S3.

At step S1, during a reset stage t1, the first scan line S1 transmits a second control signal, and a second scan line EM transmits a third control signal; the second control signal controls the data voltage writing module 04 to be turned off and controls the second transistor T2 to be turned on, the third control signal controls the first transistor T1 to be turned on and controls the fourth transistor T4 to be turned off.

At step S2, during a data voltage writing stage t2, the first scan line S1 transmits a first control signal, and the second scan line EM transmits a fourth control signal; the first control signal controls the data voltage writing module 04 to be turned on and controls the second transistor T2 to be turned off, and the fourth control signal controls the first transistor T1 to be turned off and controls the fourth transistor T4 to be turned on.

At step S3, during a light-emitting stage t3, the first scan line S1 transmits a second control signal, and the second scan line EM transmits a fourth control signal; and the second control signal controls the data voltage writing module 04 to be turned off and controls the second transistor T2 to be turned on, and the fourth control signal controls the first transistor T1 to be turned off and controls the fourth transistor T4 to be turned on.

FIG. 10 is a flowchart of a method for driving a pixel driving circuit according to another embodiment of the present disclosure.

In an embodiment of the present disclosure, referring to FIG. 4, the pixel driving circuit 001 further includes a first transistor T1, a first electrode of the first transistor T1 is electrically connected to the reset signal line SL3, and a second electrode of the first transistor T1 is electrically connected to the control terminal 23 of the driving module 02, and the gate of the first transistor T1 is electrically connected to the second scan line EM.

The light emission control module 05 includes a third transistor T3 and a fifth transistor T5 that are connected in series. A gate of the third transistor T3 is electrically connected to the first scan line S1, and a gate of the fifth transistor T5 is electrically connected to the second scan line EM. A first electrode of one of the third transistor T3 and the fifth transistor T5 is electrically connected to the output terminal 22 of the driving module 02, and a second electrode of the other of the third transistor T3 and the fifth transistor T5 is electrically connected to the light-emitting module 01.

That is, the light-emitting control module 05 can include a third transistor T3 and a fifth transistor T5 that are connected in series, and the third transistor T3 and the fifth transistor T5 jointly control to input a light-emitting driving current provided by the driving module 02 to the light-emitting module 01.

The light-emitting module 01 includes a light-emitting device 11. In an embodiment, the light-emitting device 11 is an organic light-emitting diode.

As shown in FIG. 10, the method for driving a pixel driving circuit further includes following steps.

During a reset stage t1, the first scan line S1 transmits a second control signal, and the second scan line EM transmits a third control signal; the second control signal controls the data voltage writing module 04 to be turned off and controls the third transistor T3 to be turned on, and the third control signal controls the first transistor T1 to be turned on and controls the fifth transistor T5 to be turned off.

During a data voltage writing stage t2, the first scan line S1 transmits a first control signal, and the second scan line EM transmits a fourth control signal. The first control signal controls the data voltage writing module 04 to be turned on and controls the third transistor T3 to be turned off. The fourth control signal controls the first transistor T1 to be turned off and controls the fifth transistor T5 to be turned on.

During a light-emitting stage t3, the first scan line S1 transmits a second control signal, and the second scan line EM transmits a fourth control signal. The second control signal controls the data voltage writing module 04 to be turned off and controls the third transistor T3 to be turned on. The fourth control signal controls the first transistor T1 to be turned off and controls the fifth transistor T5 to be turned on.

FIG. 11 is a timing sequence corresponding to the circuit shown in FIG. 4 according to another embodiment of the present disclosure, and FIG. 12 is a flowchart of a method for driving a pixel driving circuit according to another embodiment of the present disclosure.

In an embodiment of the present disclosure, referring to FIG. 4, the output terminal 42 of the data voltage writing module 04 is electrically connected to the input terminal 21 of the driving module 02.

The pixel driving circuit 001 further includes a seventh transistor T7. A first electrode of the seventh transistor T7 is electrically connected to the output terminal 22 of the driving module 02, a second electrode of the seventh transistor T7 is electrically connected to the control terminal 23 of the driving module 02, and a gate of the seven transistor T7 is electrically connected to the second scan line EM.

It can be understood that the display panel includes a plurality of pixel driving circuits 001. The plurality of pixel driving circuits 001 can be arranged in an array along a row direction and a column direction in the display panel. The pixel driving circuits 001 arranged in the same row can be connected to the same first scan line S1 and the same second scan line EM.

The second scan line EM electrically connected to the seventh transistor T7 in the pixel driving circuit 001 in the $n^{th}$ row is the second scan line EM electrically connected to the first transistor T1 in the pixel driving circuit 001 in the $(n+1)^{th}$ row.

As shown in FIG. 11, the light-emitting stage t3 of the pixel driving circuit 001 includes a plurality of light-emitting sub-stages P. An adjustment stage E is included between at least two adjacent light-emitting sub-stages P in the same light-emitting stage t1. It should be noted that FIG. 11 is only a schematic relationship between the light-emitting stage t3 and the light-emitting sub-stage P, and the adjustment stage E does not belong to the light-emitting stage t3.

As shown in FIG. 12, the method for driving a pixel driving circuit includes:

during an adjustment stage E, transmitting a first control signal by the first scan line S1, and transmitting a fourth control signal by the second scan line EM. The first control signal controls the data voltage writing module 04 to be turned on and controls the power voltage writing module 03 and the light-emitting control module 05 to be turned off. The fourth control signal controls the seventh transistor T7 to be turned off.

During the adjustment stage E, the second scan line EM transmits the fourth control signal. That is, the second scan line EM electrically connected to the seventh transistor T7 in the pixel driving circuit 001 transmits the fourth control signal. During the adjustment stage E, the second scan signal EM electrically connected to the first transistor T1 in the pixel driving circuit 001 transmits the fourth control signal, and the fourth control signal controls the first transistor T1 to be turned off.

From the above analysis, it can be seen that acting time of the data voltage writing module 04, the power voltage writing module 03 and the light-emitting control module 05 are completely separated, and their designs are completely independent and will not affect each other. Therefore, during the adjustment stage E, the first scan line S1 transmits a signal to control the data voltage writing module 04 to be turned on and control the power voltage writing module 03 and the light-emitting control module 05 to be turned off, and transmits the data voltage signal Vdata to the input terminal of the driving module 02, so that the bias effect of the transistors in the driving module 02 is improved, thereby improving the brightness difference between two adjacent light-emitting sub-phases P without affecting the normal operation of the pixel driving circuit 001.

Figure 13:
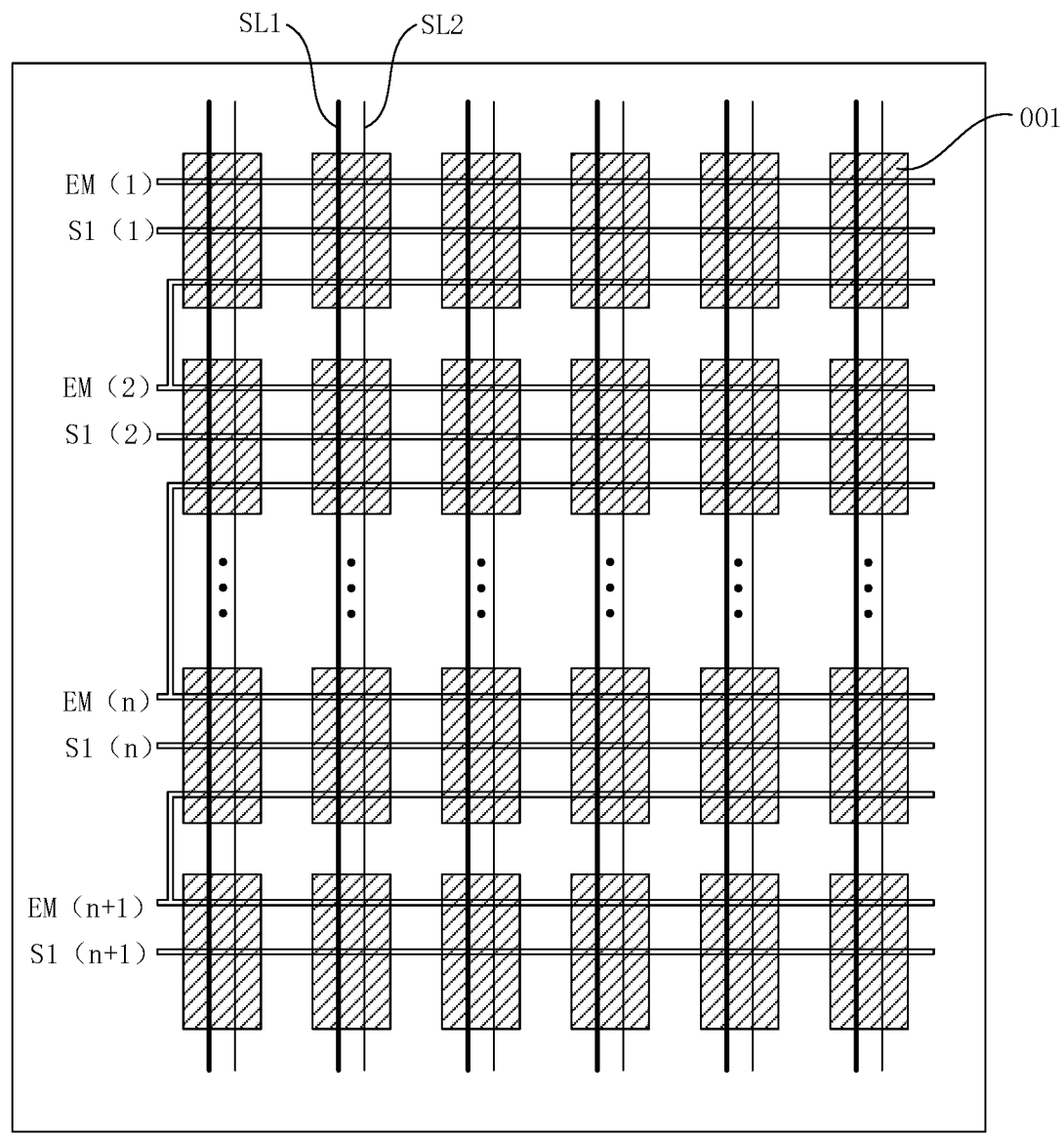
FIG. 13 is a schematic diagram of a display panel according to an embodiment of the present disclosure.

FIG. 13 is a schematic diagram of a display panel according to an embodiment of the present disclosure.

The present disclosure provides a display panel 100. As shown in FIG. 13, the display panel 100 includes a plurality of pixel driving circuit 001 provided in the above-mentioned embodiments. The plurality of pixel driving circuits 001 can be arranged in an array along a row direction and a column direction in the display panel 100.

The pixel driving circuits 001 arranged in the same row can be connected to the same first scan line S1 and the same second scan line EM. The seventh transistor T7 in the pixel driving circuit 001 in the $n^{th}$ row and the first transistor T1 in the pixel driving circuit 001 in the $(n+1)^{th}$ row can be connected to the same second scan line EM.

In the display panel 100, the first control terminal 33 of the power voltage writing module 03, the second control terminal 53 of the light-emitting control module 05 and the control terminal 43 of the data voltage writing module 04 are all electrically connected to the same first scan line S1, the number of control lines for driving the pixel driving circuit 001 in the display panel is reduced, that is, the number of scanning lines does not need to be increased compared to the pixel driving circuit that only includes silicon-based active layer transistors. In the case of satisfying the electrical specifications and the optical specifications of the display panel, the space specification of the layout design of the pixel driving circuit in the display panel is satisfied simultaneously. The width of the bezel of the display panel will not be increased, thereby meeting the user's demand for a narrow border.

Figure 14:
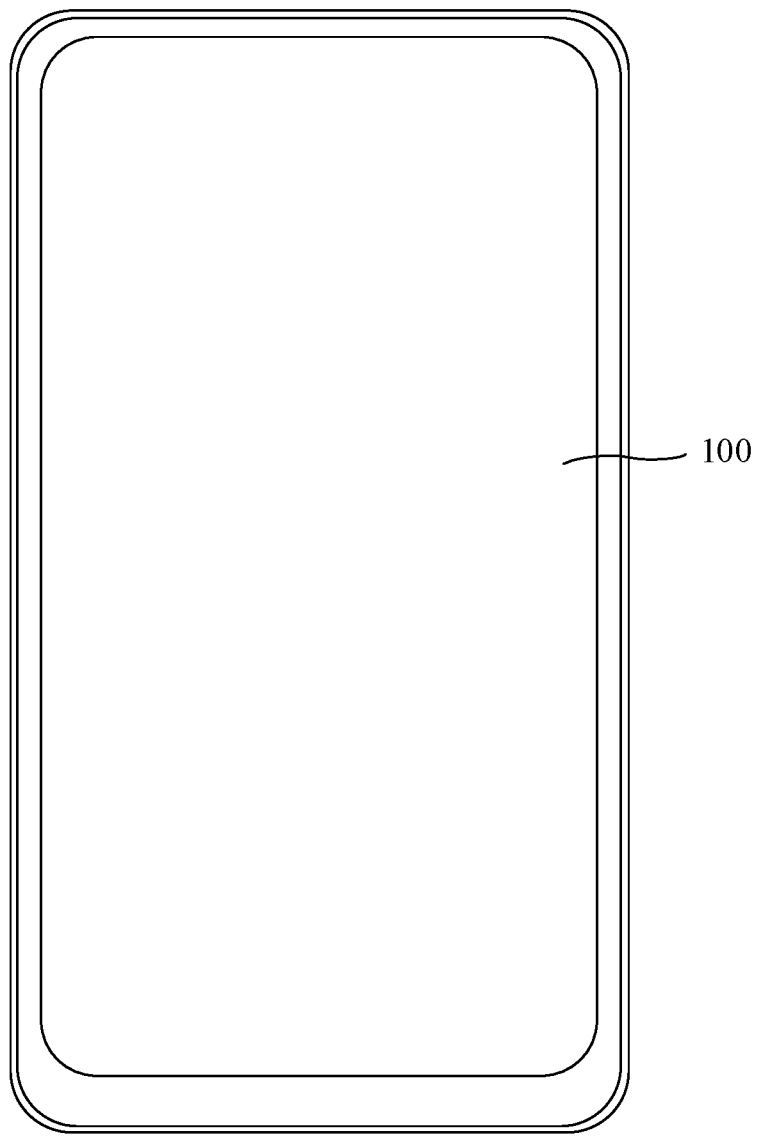
FIG. 14 is a schematic diagram of a display apparatus according to an embodiment of the present disclosure.

FIG. 14 is a schematic diagram of a display apparatus according to an embodiment of the present disclosure.

As shown in FIG. 14, the present disclosure provides a display apparatus 200. The display apparatus 200 includes the display panel 100 provided in the foregoing embodiments. The display apparatus 200 provided by the present disclosure can be a mobile phone, a computer, or a TV.

In the display apparatus 200, since the first control terminal 33 of the power voltage writing module 03, the second control terminal 53 of the light-emitting control module 05, and the control terminal 43 of the data voltage writing module 04 are all electrically connected to the same first scan line S1, the number of control lines for driving the pixel driving circuit 001 in the display panel 100 is reduced, that is, the number of scanning lines does not need to be increased compared to the pixel driving circuit including only silicon-based active layer transistors. In the case of satisfying the electrical specifications and the optical specifications of the display panel, the space specification of the layout design of the pixel driving circuit in the display panel is satisfied simultaneously. The width of the bezel of the display panel will not be increased, thereby meeting the user's demand for a narrow border.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A pixel drive circuit, comprising:
    a light-emitting circuit;
    a driving circuit configured to provide a light-emitting driving current for the light-emitting circuit and comprising an input terminal and an output terminal;
    a power voltage writing circuit comprising a first input terminal, a first output terminal, and a first control terminal, wherein the first input terminal is electrically connected to a power voltage signal line, and the first output terminal is electrically connected to the input terminal of the driving circuit;
    a data voltage writing circuit comprising an input terminal electrically connected to a data voltage signal line, an output terminal electrically connected to the driving circuit, and a control terminal, wherein the data voltage writing circuit is configured to input a data voltage signal to the driving circuit; and
    a light-emitting control circuit comprising a second input terminal, a second output terminal, and a second control terminal, wherein the second input terminal is electrically connected to the output terminal of the driving circuit, and the second output terminal is electrically connected to the light-emitting circuit;
    wherein the first control terminal of the power voltage writing circuit, the second control terminal of the light-emitting control circuit, and the control terminal of the data voltage writing circuit are electrically connected to a first scan line, and the power voltage writing circuit and the light-emitting control circuit are controlled to be turned off by a signal of the first scan line when the data voltage writing circuit is controlled to be turned on by the signal of the first scan line;
    wherein the power voltage writing circuit comprises a second transistor comprising a gate electrically connected to the first scan line, and the light-emitting control circuit comprises a third transistor comprising a gate electrically connected to the first scan line; and
    wherein the data voltage writing circuit comprises: a sixth transistor comprising a first electrode electrically connected to the data voltage signal line, a second electrode electrically connected to the driving circuit, and a gate electrically connected to the first scan line, wherein the sixth transistor has a different channel type from the second transistor and the third transistor.

2. The pixel driving circuit according to claim 1, further comprising:
    a first reset circuit comprising an input terminal electrically connected to a reset signal line, an output terminal electrically connected to a control terminal of the driving circuit, and a control terminal electrically connected to a second scan line, wherein the data voltage writing circuit is electrically insulated from the control terminal of the driving circuit when the first reset circuit is controlled to be turned on by the second scan line.

3. The pixel driving circuit according to claim 2, wherein the first reset circuit comprises:
a first transistor, comprising a first electrode electrically connected to the reset signal line, a second electrode electrically connected to the control terminal of the driving circuit, and a gate electrically connected to the second scan line, wherein the first transistor comprises a metal oxide active layer.

4. The pixel driving circuit according to claim 2, wherein the second transistor and the data voltage writing circuit that are controlled by the signal of the first scan line have different on-off states, and the third transistor and the data voltage writing circuit that are controlled by the signal of the first scan line have different on-off states.

5. The pixel driving circuit according to claim 4, wherein the second transistor and the third transistor each comprise a metal oxide active layer.

6. The pixel driving circuit according to claim 4, wherein the second transistor comprises a first electrode electrically connected to the power voltage signal line, and a second electrode electrically connected to the input terminal of the driving circuit.

7. The pixel driving circuit according to claim 4, wherein the power voltage writing circuit further comprises a fourth transistor connected in series to the second transistor, wherein a first electrode of one of the second transistor and the fourth transistor is electrically connected to the power voltage signal line, and a second electrode of another one of the second transistor and the fourth transistor is electrically connected to the input terminal of the driving circuit; and
wherein the gate of the second transistor is electrically connected to the first scan line, and a gate of the fourth transistor is electrically connected to the second scan line; the second transistor and the data voltage writing circuit that are controlled by the signal of the first scan line have different on-off states, and the fourth transistor and the first reset circuit that are controlled by a signal of the second scan line have different on-off states.

8. The pixel driving circuit according to claim 7, wherein the second transistor comprises a metal oxide active layer having a channel width-to-length ratio greater than a channel width-to-length ratio of an active layer of the four transistor.

9. The pixel driving circuit according to claim 7, wherein the second transistor comprises a metal oxide active layer, and a distance between the gate and the metal oxide active layer of the second transistor is greater than a distance between the gate and an active layer of the fourth transistor.

10. The pixel driving circuit according to claim 4, wherein the third transistor comprises a first electrode electrically connected to the output terminal of the driving circuit and a second electrode electrically connected to the light-emitting circuit.

11. The pixel driving circuit according to claim 4, wherein the light-emitting control circuit further comprises a fifth transistor connected in series to the third transistor; and a first electrode of one of the third transistor and the fifth transistor is electrically connected to the output terminal of the driving circuit, and a second electrode of another one of the third transistor and the five transistor is electrically connected to the light-emitting circuit; and the gate of the third transistor is electrically connected to the first scan line, and a gate of the fifth transistor is electrically connected to the second scan line; the third transistor and the data voltage writing circuit that are controlled by the signal of the first scan line have different on-off states, and the fifth transistor and the first reset circuit that are controlled by a signal of the second scan line have different on-off states.

12. The pixel driving circuit according to claim 11, wherein the third transistor comprises a metal oxide active layer having a channel width-to length ratio greater than a channel width-to-length ratio of an active layer of the fifth transistor; or
wherein the third transistor comprises a metal oxide active layer, and a distance between the gate and the metal oxide active layer of the third transistor is greater than a distance between the gate and an active layer of the fifth transistor.

13. The pixel driving circuit according to claim 1, wherein the output terminal of the data voltage writing circuit is electrically connected to the input terminal of the driving circuit;
the pixel driving circuit further comprises a seventh transistor comprising a first electrode electrically connected to the output terminal of the driving circuit, a second electrode electrically connected to the control terminal of the driving circuit, and a gate electrically connected to another second scan line;
another pixel driving circuit comprises another first transistor, the seventh transistor of the pixel driving circuit and the another first transistor of the another pixel driving circuit are electrically connected to the another second scan line, a light-emitting driving current is generated by the pixel driving circuit prior to a moment when a light-emitting driving current is generated by the another pixel driving circuit; and
wherein the seventh transistor has a same channel type as the another first transistor.

14. The pixel driving circuit according to claim 1, wherein the pixel driving circuit further comprises a second reset circuit comprising an input terminal electrically connected to the reset signal line, an output terminal electrically connected to the light-emitting circuit, and a control terminal electrically connected to the first scan line;
wherein the second reset circuit and the data voltage writing circuit that are controlled by the signal of the first scan line have a same on-off state;
wherein the second reset circuit comprises an eighth transistor comprising a source electrically connected to the reset signal line, a drain electrically connected to the light-emitting circuit, and a gate electrically connected to the first scan line; and
wherein the eighth transistor has a same channel type as the sixth transistor.

15. A method for driving a pixel driving circuit, wherein the pixel driving circuit comprises:
a light-emitting circuit;
a driving circuit configured to provide a light-emitting driving current for the light-emitting circuit and comprising an input terminal and an output terminal;
a power voltage writing circuit comprising a first input terminal, a first output terminal, and a first control terminal, wherein the first input terminal is electrically connected to a power voltage signal line, and the first output terminal is electrically connected to the input terminal of the driving circuit;

a data voltage writing circuit comprising an input terminal electrically connected to a data voltage signal line, an output terminal electrically connected to the driving circuit, and a control terminal, wherein the data voltage writing circuit is configured to input a data voltage signal to the driving circuit; and a light-emitting control circuit comprising a second input terminal, a second output terminal, and a second control terminal, wherein the second input terminal is electrically connected to the output terminal of the driving circuit, and the second output terminal is electrically connected to the light-emitting circuit; the first control terminal of the power voltage writing circuit, the second control terminal of the light-emitting control circuit, and the control terminal of the data voltage writing circuit are electrically connected to a first scan line; wherein the power voltage writing circuit comprises a second transistor comprising a gate electrically connected to the first scan line, and the light-emitting control circuit comprises a third transistor comprising a gate electrically connected to the first scan line; and wherein the data voltage writing circuit comprises: a sixth transistor comprising a first electrode electrically connected to the data voltage signal line, a second electrode electrically connected to the driving circuit, and a gate electrically connected to the first scan line, wherein the sixth transistor has a different channel type from the second transistor and the third transistor; and wherein the method comprises:
during a data voltage writing stage, transmitting a first control signal by the first scan line, controlling, by the first control signal, the data voltage writing circuit to be turned on, and controlling, by the first control signal, the power voltage writing circuit and the light-emitting control circuit to be turned off.

16. The method according to claim 15, wherein the pixel driving circuit further comprises a first transistor comprising a first electrode electrically connected to the reset signal line, a second electrode electrically connected to the control terminal of the driving circuit, and a gate electrically connected to a second scan line;

the power voltage writing circuit comprises a fourth transistor connected in series with the second transistor, wherein the fourth transistor comprises a gate electrically connected to the second scan line; and a first electrode of one of the second transistor and the fourth transistor is electrically connected to the power voltage signal line, and a second electrode of another one of the second transistor and the fourth transistor is electrically connected to the input terminal of the driving circuit; and the method further comprises:
during a reset stage, transmitting a second control signal by the first scan line, transmitting a third control signal by the second scan line, controlling, by the second control signal, the data voltage writing circuit to be turned off and the second transistor to be turned on, and controlling, by the third control signal, the first transistor to be turned on and the fourth transistor to be turned off;

during the data voltage writing stage, transmitting by the first scan line the first control signal, transmitting by the second scan line a fourth control signal, controlling, by the first control signal, the data voltage writing circuit to be turned on and the second transistor to be turned off, and controlling, by the fourth control signal, the first transistor to be turned off and the fourth transistor to be turned on; and during a light-emitting stage, transmitting the second control signal by the first scan line, transmitting the fourth control signal by the second scan line, controlling, by the second control signal, the data voltage writing circuit to be turned off and the second transistor to be turned on, and controlling, by the fourth control signal, the first transistor to be turned off and the fourth transistor to be turned on, wherein the pixel driving circuit further comprises a first transistor comprising a first electrode electrically connected to the reset signal line, a second electrode electrically connected to the control terminal of the driving circuit, and a gate electrically connected to a second scan line;

the light-emitting control circuit comprises a third transistor and a fifth transistor connected in series with the third transistor, and the fifth transistor comprises a gate electrically connected to the second scan line; and a first electrode of one of the third transistor and the fifth transistor is electrically connected to the output terminal of the driving circuit, and a second electrode of another one of the third transistor and the fifth transistor is electrically connected to the light-emitting circuit; and the method further comprises:
during the reset stage, transmitting a second control signal by the first scan line, transmitting a third control signal by the second scan line, controlling, by the second control signal, the data voltage writing circuit to be turned off and the third transistor to be turned on, and controlling, by the third control signal, the first transistor to be turned on and the fifth transistor to be turned off;

during the data voltage writing stage, transmitting the first control signal by the first scan line, transmitting a fourth control signal by the second scan line, controlling, by the first control signal, the data voltage writing circuit to be turned on and the third transistor to be turned off, and controlling, by the fourth control signal, the first transistor to be turned off and the fifth transistor to be turned on; and during the light-emitting stage, transmitting the second control signal by the first scan line, transmitting the fourth control signal by the second scan line, controlling, by the second control signal, the data voltage writing circuit to be turned off and the third transistor to be turned on, and controlling, by the fourth control signal, the first transistor to be turned off and the fifth transistor to be turned on.

17. The method according to claim 15, wherein the pixel driving circuit further comprises a first transistor, a first electrode of the first transistor is electrically connected to the reset signal line, and a second electrode of the first transistor is electrically connected to the control terminal of the driving circuit, and a gate electrode of the first transistor is electrically connected to the second scan line;

the light-emitting control circuit comprises a third transistor and a fifth transistor connected in series, a gate electrode of the third transistor is electrically connected to the first scan line, and a gate electrode of the fifth transistor is electrically connected to the second scan line; a first electrode of one of the third transistor and the fifth transistor is electrically connected to the output terminal of the driving circuit, and a second electrode of the other of the third transistor and the fifth transistor is electrically connected to the light-emitting circuit;

the method further comprises:

in a reset stage, the first scan line transmits a second control signal, and the second scan line transmits a third control signal; the second control signal controls the data voltage writing circuit to be turned off and controls the third transistor to be turned on, the third control signal controls the first transistor to be turned on and controls the fifth transistor to be turned off;

in the data voltage writing stage, the first scan line transmits a first control signal, and the second scan line transmits a fourth control signal; the first control signal controls the data voltage writing circuit to be turned on and controls the third transistor to be turned off, the fourth control signal controls the first transistor to be turned off and controls the fifth transistor to be turned on; and in a light-emitting stage, the first scan line transmits a second control signal, the second scan line transmits a fourth control signal; the second control signal controls the data voltage writing circuit to be turned off and controls the third transistor to be turned on, the fourth control signal controls the first transistor to be turned off and controls the fifth transistor to be turned on.

18. The method according to claim 15, wherein the output terminal of the data voltage writing circuit is electrically connected to the input terminal of the driving circuit;

the pixel driving circuit further comprises a seventh transistor, a first electrode of the seventh transistor is electrically connected to the output terminal of the driving circuit, and a second electrode of the seventh transistor is electrically connected to the control terminal of the driving circuit; a gate electrode of the seventh transistor is electrically connected to the second scan line;

a light-emitting stage of the pixel driving circuit comprises a plurality of light-emitting sub-stages, and an adjustment stage is comprised between at least two adjacent light-emitting sub-stages in the same light-emitting stage;

the method comprises:

in the adjustment stage, the first scan line transmits a first control signal, and the second scan line transmits a fourth control signal; the first control signal controls the data voltage writing circuit to be turned on and controls the power voltage writing circuit and the light-emitting control circuit to be turned off, and the fourth control signal controls the seventh transistor to be turned off.

19. A display panel, comprising a pixel driving circuit, wherein the pixel drive circuit comprises:

a light-emitting circuit;

a driving circuit configured to provide a light-emitting driving current for the light-emitting circuit and comprising an input terminal and an output terminal;

a power voltage writing circuit comprising a first input terminal, a first output terminal, and a first control terminal, wherein the first input terminal is electrically connected to a power voltage signal line, and the first output terminal is electrically connected to the input terminal of the driving circuit;

a data voltage writing circuit comprising an input terminal electrically connected to a data voltage signal line, an output terminal electrically connected to the driving circuit, and an control terminal, wherein the data voltage writing circuit is configured to input a data voltage signal to the driving circuit; and a light-emitting control circuit comprising a second input terminal, a second output terminal, and a second control terminal, wherein the second input terminal is electrically connected to the output terminal of the driving circuit, and the second output terminal is electrically connected to the light-emitting circuit;

wherein the first control terminal of the power voltage writing circuit, the second control terminal of the light-emitting control circuit, and the control terminal of the data voltage writing circuit are electrically connected to a first scan line, and the power voltage writing circuit and the light-emitting control circuit are controlled to be turned off by a signal of the first scan line when the data voltage writing circuit is controlled to be turned on by the signal of the first scan line and provides a data voltage to the driving module;

wherein the power voltage writing circuit comprises a second transistor comprising a gate electrically connected to the first scan line, and the light-emitting control circuit comprises a third transistor comprising a gate electrically connected to the first scan line; and wherein the data voltage writing circuit comprises: a sixth transistor comprising a first electrode electrically connected to the data voltage signal line, a second electrode electrically connected to the driving circuit, and a gate electrically connected to the first scan line, wherein the sixth transistor has a different channel type from the second transistor and the third transistor.

* * * * *